US010594961B2

(12) United States Patent
Hirota et al.

(10) Patent No.: US 10,594,961 B2
(45) Date of Patent: Mar. 17, 2020

(54) GENERATION OF PIXEL SIGNAL WITH A HIGH DYNAMIC RANGE AND GENERATION OF PHASE DIFFERENCE INFORMATION

(71) Applicant: SONY CORPORATION, Tokyo (JP)

(72) Inventors: Isao Hirota, Kanagawa (JP); Masao Matsumura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/128,324

(22) PCT Filed: Mar. 17, 2015

(86) PCT No.: PCT/JP2015/057840
§ 371 (c)(1),
(2) Date: Sep. 22, 2016

(87) PCT Pub. No.: WO2015/151794
PCT Pub. Date: Oct. 8, 2015

(65) Prior Publication Data
US 2017/0104942 A1 Apr. 13, 2017

(30) Foreign Application Priority Data

Mar. 31, 2014 (JP) .................................. 2014-071756
Dec. 22, 2014 (JP) .................................. 2014-258941

(51) Int. Cl.
H04N 5/355 (2011.01)
H01L 27/146 (2006.01)
H04N 5/369 (2011.01)

(52) U.S. Cl.
CPC ..... H04N 5/35563 (2013.01); H01L 27/1461 (2013.01); H01L 27/14621 (2013.01);
(Continued)

(58) Field of Classification Search
CPC .......... H04N 5/35563; H04N 5/35554; H04N 5/3696
See application file for complete search history.

(56) References Cited

U.S. PATENT DOCUMENTS 5,037,777 A * 8/1991 Mele .................. H01L 21/3105
148/DIG. 133
5,340,770 A * 8/1994 Allman ............... H01L 21/2255
257/E21.149
(Continued)

FOREIGN PATENT DOCUMENTS

JP 2004-048445 A 2/2004
JP 2008-113029 A 5/2008
(Continued)

OTHER PUBLICATIONS

Office Action for JP Patent Application No. 2014-258941, dated Mar. 13, 2018, 06 pages of Office Action and 04 pages of English Translation.

Primary Examiner — Cynthia Segura
(74) Attorney, Agent, or Firm — Chip Law Group

(57) ABSTRACT

The present disclosure relates to a solid state imaging device, a drive control method therefor, an image processing method, and an electronic apparatus capable of achieving both generation of a pixel signal with a high dynamic range and generation of phase difference information. A pixel array unit of the solid state imaging device is configured such that a plurality of pixels each having the same light receiving region is arranged in a matrix, and light that has entered a single microlens enters the plurality of pixels adjacent to each other. In addition, a first pixel and a second pixel included in the plurality of pixels below the microlens of the pixel array unit are set to have a sensitivity difference. The
(Continued)

technique of the present disclosure can be applied to, for example, a solid state imaging device or the like.

12 Claims, 33 Drawing Sheets

(52) U.S. Cl.
CPC .. *H01L 27/14623* (2013.01); *H01L 27/14627* (2013.01); *H01L 27/14643* (2013.01); *H04N 5/35554* (2013.01); *H04N 5/3696* (2013.01)

(56) References Cited

U.S. PATENT DOCUMENTS

| | | | | |
|---|---|---|---|---|
| 5,341,014 | A * | 8/1994 | Fujii | H01L 21/32155 257/377 |
| 5,346,843 | A * | 9/1994 | Kuroda | H01L 27/10808 257/E27.081 |
| 5,399,518 | A * | 3/1995 | Sim | H01L 27/10817 257/E21.019 |
| 6,744,032 | B1 * | 6/2004 | Tay | H01L 27/14627 250/208.1 |
| 8,305,471 | B2 * | 11/2012 | Bechtel | H04N 5/353 348/222.1 |
| 8,698,927 | B2 * | 4/2014 | Nagano | H04N 5/23212 348/294 |
| 9,083,898 | B2 * | 7/2015 | Kanemitsu | H04N 5/3572 |
| 9,191,636 | B2 * | 11/2015 | Kiyota | H04N 9/045 |
| 9,217,709 | B2 * | 12/2015 | Tezuka | G01N 21/25 |
| 9,288,382 | B2 * | 3/2016 | Fujii | H04N 5/347 |
| 9,761,625 | B2 * | 9/2017 | Kimura | H01L 27/14643 |
| 9,778,102 | B2 * | 10/2017 | Pang | G01J 1/4204 |
| 9,918,031 | B2 * | 3/2018 | Sakioka | H04N 5/3745 |
| 9,936,172 | B2 * | 4/2018 | Sugiyama | H04N 9/045 |
| 9,961,282 | B2 * | 5/2018 | Yamazaki | H01L 27/14605 |
| 2005/0179794 | A1 * | 8/2005 | Misawa | H04N 5/2355 348/294 |
| 2009/0002528 | A1 * | 1/2009 | Manabe | H04N 5/2355 348/248 |
| 2009/0225217 | A1 * | 9/2009 | Katsuda | G02B 7/346 348/366 |
| 2010/0277623 | A1 * | 11/2010 | Tejada | H04N 5/35554 348/241 |
| 2011/0058070 | A1 * | 3/2011 | Awazu | H04N 5/23212 348/241 |
| 2011/0228053 | A1 * | 9/2011 | Aoki | H04N 5/23212 348/49 |
| 2012/0287294 | A1 * | 11/2012 | Kaizu | H04N 5/2355 348/208.4 |
| 2012/0293707 | A1 * | 11/2012 | Nagano | H04N 5/23212 348/345 |
| 2012/0314107 | A1 * | 12/2012 | Kanemitsu | H04N 9/045 348/246 |
| 2013/0161774 | A1 * | 6/2013 | Okigawa | G02B 3/0056 257/432 |
| 2013/0222553 | A1 * | 8/2013 | Tsuchita | H01L 27/14627 348/49 |
| 2013/0258097 | A1 * | 10/2013 | Yamada | G01C 3/08 348/135 |
| 2013/0307106 | A1 * | 11/2013 | Egawa | H01L 27/14607 257/432 |
| 2014/0022354 | A1 * | 1/2014 | Okigawa | H04N 5/347 348/46 |
| 2014/0111681 | A1 * | 4/2014 | Fukuda | G02B 7/34 348/340 |
| 2014/0168498 | A1 * | 6/2014 | Ono | G03B 11/00 348/335 |
| 2014/0253767 | A1 * | 9/2014 | Kato | H01L 27/14625 348/280 |
| 2015/0009383 | A1 * | 1/2015 | Fujii | H04N 5/347 348/302 |
| 2015/0179695 | A1 * | 6/2015 | Lyu | H01L 27/14643 257/292 |
| 2015/0222833 | A1 * | 8/2015 | Murata | G02B 7/34 250/208.1 |
| 2015/0312461 | A1 * | 10/2015 | Kim | H01L 27/14609 348/308 |
| 2016/0049430 | A1 * | 2/2016 | Nomura | H01L 27/14623 257/432 |
| 2016/0218127 | A1 * | 7/2016 | Kato | H01L 27/14609 |
| 2016/0219232 | A1 * | 7/2016 | Murata | H04N 5/361 |
| 2016/0269655 | A1 * | 9/2016 | Numata | H01L 27/14605 |
| 2016/0269658 | A1 * | 9/2016 | Choi | H01L 27/14623 |
| 2017/0163917 | A1 * | 6/2017 | Yamada | H01L 27/14603 |
| 2017/0180628 | A1 * | 6/2017 | Kato | H04N 5/23212 |
| 2017/0186774 | A1 * | 6/2017 | Sakakura | H01L 27/124 |
| 2017/0353678 | A1 * | 12/2017 | Ogushi | H04N 5/23212 |
| 2017/0353679 | A1 * | 12/2017 | Negishi | H04N 5/23212 |
| 2017/0366770 | A1 * | 12/2017 | Yokogawa | H04N 5/23212 |

FOREIGN PATENT DOCUMENTS

| | | |
|---|---|---|
| JP | 2010-237401 A | 9/2010 |
| JP | 2010-237401 A | 10/2010 |
| JP | 2011-204797 A | 10/2011 |

* cited by examiner

FIG. 6
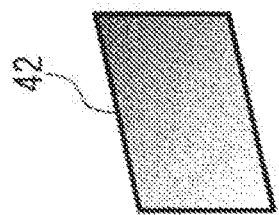
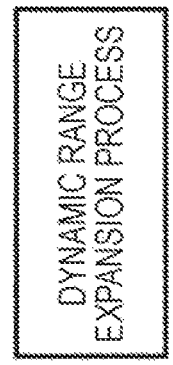
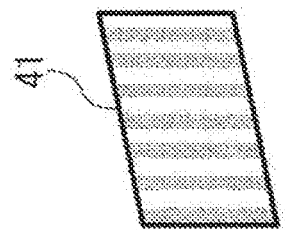

FIG. 7
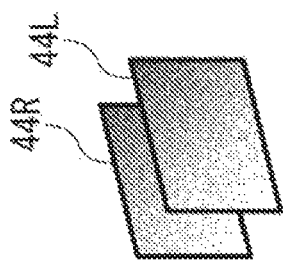
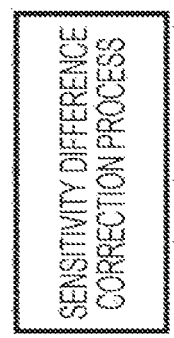
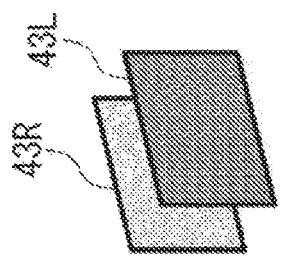

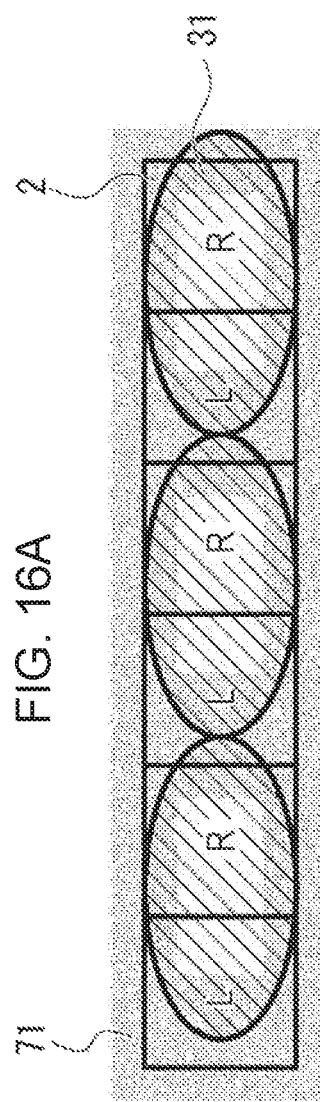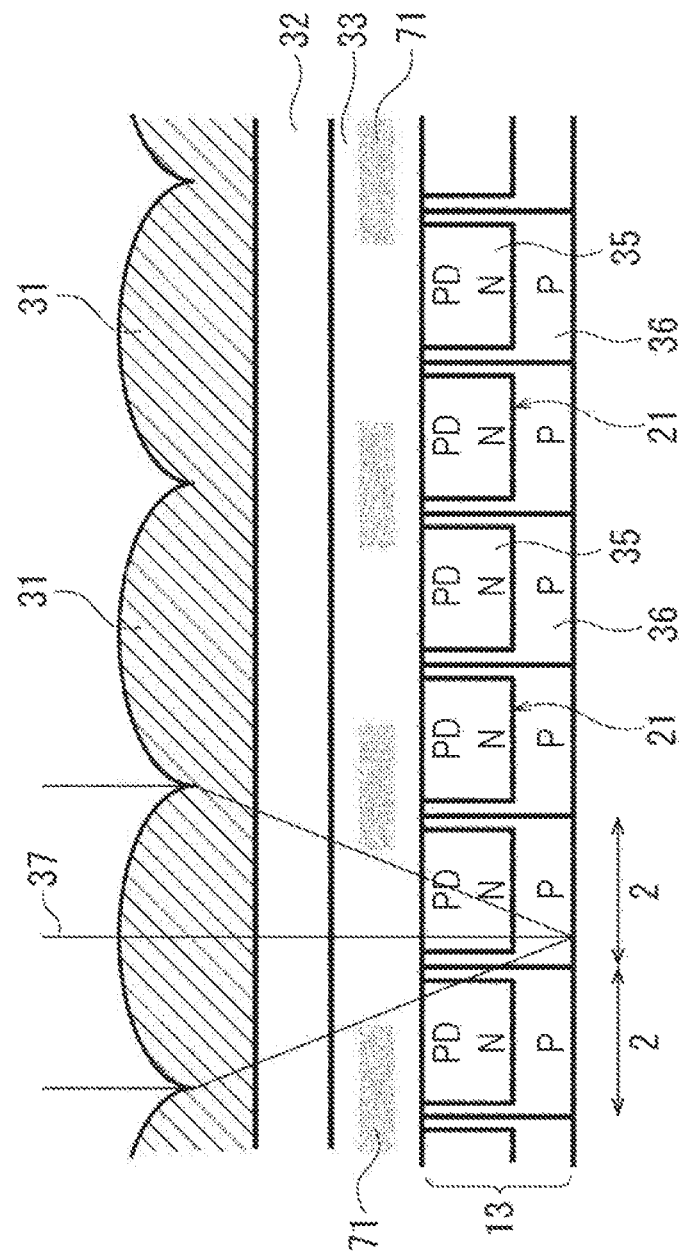

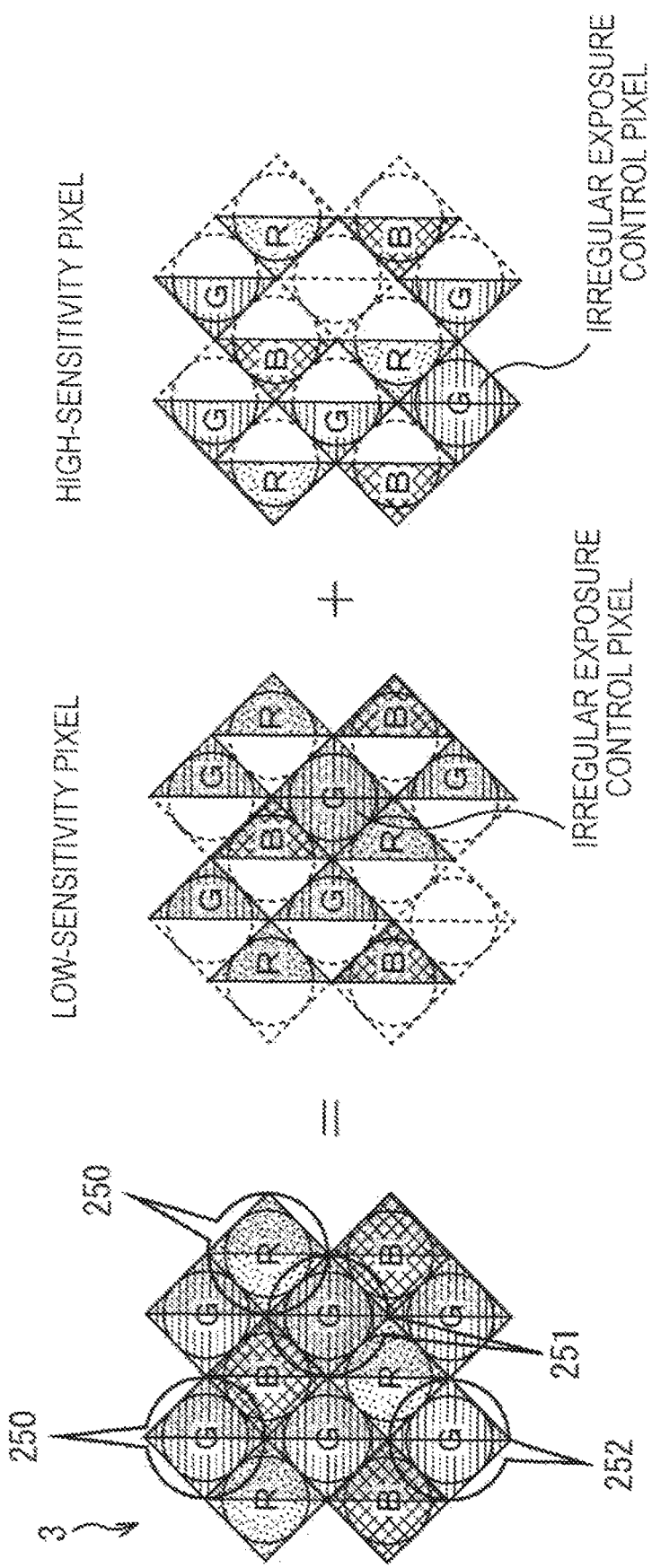

FIG. 29
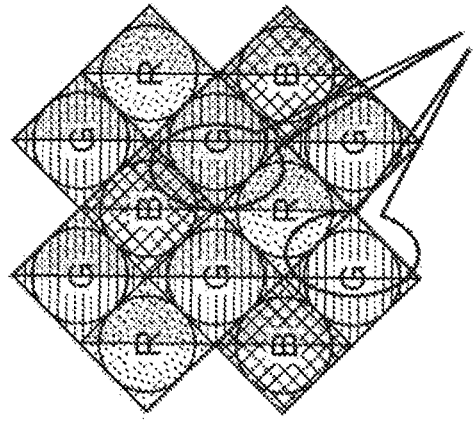
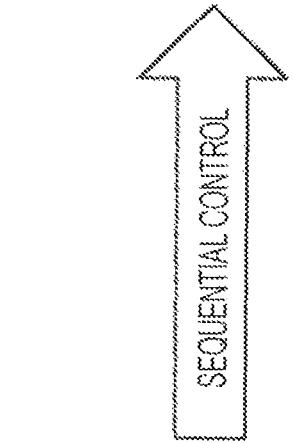
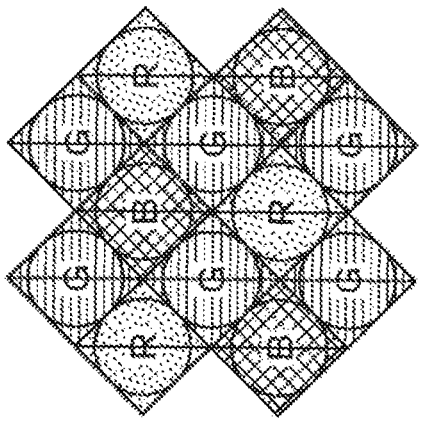

GENERATION OF PIXEL SIGNAL WITH A HIGH DYNAMIC RANGE AND GENERATION OF PHASE DIFFERENCE INFORMATION

CROSS REFERENCE TO RELATED APPLICATIONS

This application is a U.S. National Phase of International Patent Application No. PCT/JP2015/057840 filed on Mar. 17, 2015, which claims priority benefit of Japanese Patent Application No. 2014-071756 filed in the Japan Patent Office on Mar. 31, 2014 and Japanese Patent Application No. 2014-258941 filed in the Japan Patent Office on Dec. 22, 2014. Each of the above-referenced applications is hereby incorporated herein by reference in its entirety.

TECHNICAL FIELD

The present disclosure relates to a solid state imaging device, a drive control method therefor, an image processing method, and an electronic apparatus, and particularly relates to a solid state imaging device, a drive control method therefor, an image processing method, and an electronic apparatus capable of achieving both generation of a pixel signal with a high dynamic range and generation of phase difference information.

BACKGROUND ART

Such a technique has been disclosed that a plurality of photoelectric conversion elements having different areas of light receiving regions is provided within a single pixel in a solid state imaging device, whereby a high-sensitivity pixel signal and a low-sensitivity pixel signal are generated, and a pixel signal with a high dynamic range is generated from these pixel signals (for example, refer to Patent Document 1).

CITATION LIST

Patent Document

Patent Document 1: Japanese Patent Application Laid-Open No. 2008-113029

SUMMARY OF THE INVENTION

Problems to be Solved by the Invention

However, it has been difficult to achieve both generation of a pixel signal with a high dynamic range and generation of phase difference information.

The present disclosure has been made in consideration of such circumstances for achieving both generation of a pixel signal with a high dynamic range and generation of phase difference information.

Solutions to Problems

A solid state imaging device according to a first aspect of the present disclosure includes a pixel array unit configured such that a plurality of pixels each having the same light receiving region is arranged in a matrix, and light that has entered a single microlens enters the plurality of pixels adjacent to each other, wherein a first pixel and a second pixel included in the plurality of pixels below the microlens of the pixel array unit are set to have a sensitivity difference.

A drive control method for a solid state imaging device according to a second aspect of the present disclosure is configured such that a pixel array unit is configured such that a plurality of pixels each having the same light receiving region is arranged in a matrix, and light that has entered a single microlens enters the plurality of pixels adjacent to each other, and a first pixel and a second pixel included in the plurality of pixels below the microlens of the pixel array unit are set to have a sensitivity difference.

An electronic apparatus according to a third aspect of the present disclosure includes a pixel array unit configured such that a plurality of pixels each having the same light receiving region is arranged in a matrix, and light that has entered a single microlens enters the plurality of pixels adjacent to each other, and a first pixel and a second pixel included in the plurality of pixels below the microlens of the pixel array unit are set to have a sensitivity difference.

In the first to third aspects of the present disclosure, the pixel array unit is configured such that light that has entered the single microlens enters the plurality of pixels adjacent to each other, and the first pixel and the second pixel included in the plurality of pixels below the microlens of the pixel array unit are set to have the sensitivity difference.

An image processing method according to a fourth aspect of the present disclosure is configured such that a pixel array unit in which a plurality of pixels each having the same light receiving region is arranged in a matrix is configured such that light that has entered a single microlens enters the plurality of pixels adjacent to each other, and a signal processing circuit, which processes a signal output from a solid state imaging device in which the plurality of pixels are classified into a high-sensitivity pixel and a low-sensitivity pixel due to displacement between an optical axis of the microlens and a center position of the plurality of pixels, executes a predetermined signal process using a high-sensitivity pixel signal output from the high-sensitivity pixel and a low-sensitivity pixel signal output from the low-sensitivity pixel.

An electronic apparatus according to a fifth aspect of the present disclosure includes: a solid state imaging device at least having a pixel array unit configured such that a plurality of pixels each having the same light receiving region is arranged in a matrix, and light that has entered a single microlens enters the plurality of pixels adjacent to each other; and a signal processing circuit that executes a predetermined signal process using a high-sensitivity pixel signal output from a high-sensitivity pixel and a low-sensitivity pixel signal output from a low-sensitivity pixel, wherein the plurality of pixels are classified into the high-sensitivity pixel and the low-sensitivity pixel due to displacement between an optical axis of the microlens and a center position of the plurality of pixels.

In the fourth and fifth aspects of the present disclosure, the pixel array unit of the solid state imaging device is configured such that light that has entered the single microlens enters the plurality of pixels adjacent to each other, and the plurality of pixels are classified into the high-sensitivity pixel and the low-sensitivity pixel due to the displacement between the optical axis of the microlens and the center position of the plurality of pixels, and the predetermined signal process is executed using the high-sensitivity pixel signal output from the high-sensitivity pixel and the low-sensitivity pixel signal output from the low-sensitivity pixel.

The solid state imaging device and the electronic apparatus may be independent devices, or may be modules incorporated in other devices.

Effects of the Invention

According to first to third aspects of the present disclosure, it is possible to achieve both generation of a pixel signal with a high dynamic range and generation of phase difference information.

According to fourth and fifth aspects of the present disclosure, it is possible to generate a pixel signal with a high dynamic range by means of a simpler configuration.

Note that the effects described herein are not necessarily limited, and any of effects described in the present disclosure may be obtained.

BRIEF DESCRIPTION OF DRAWINGS

FIG. 6 is a diagram explaining a first signal process that is performed by a signal processing circuit.

FIG. 7 is a diagram explaining a second signal process that is performed by the signal processing circuit.

FIG. 16A and FIG. 16B are diagrams illustrating another pixel structure of the solid state imaging device.

FIG. 27 is a diagram explaining exemplary fifth exposure control for phase difference detection.

FIG. 29 is a diagram explaining an operation mode for photographing a still picture.

MODE FOR CARRYING OUT THE INVENTION

<Exemplary Schematic Configuration of Solid State Imaging Device>

Figure 1:
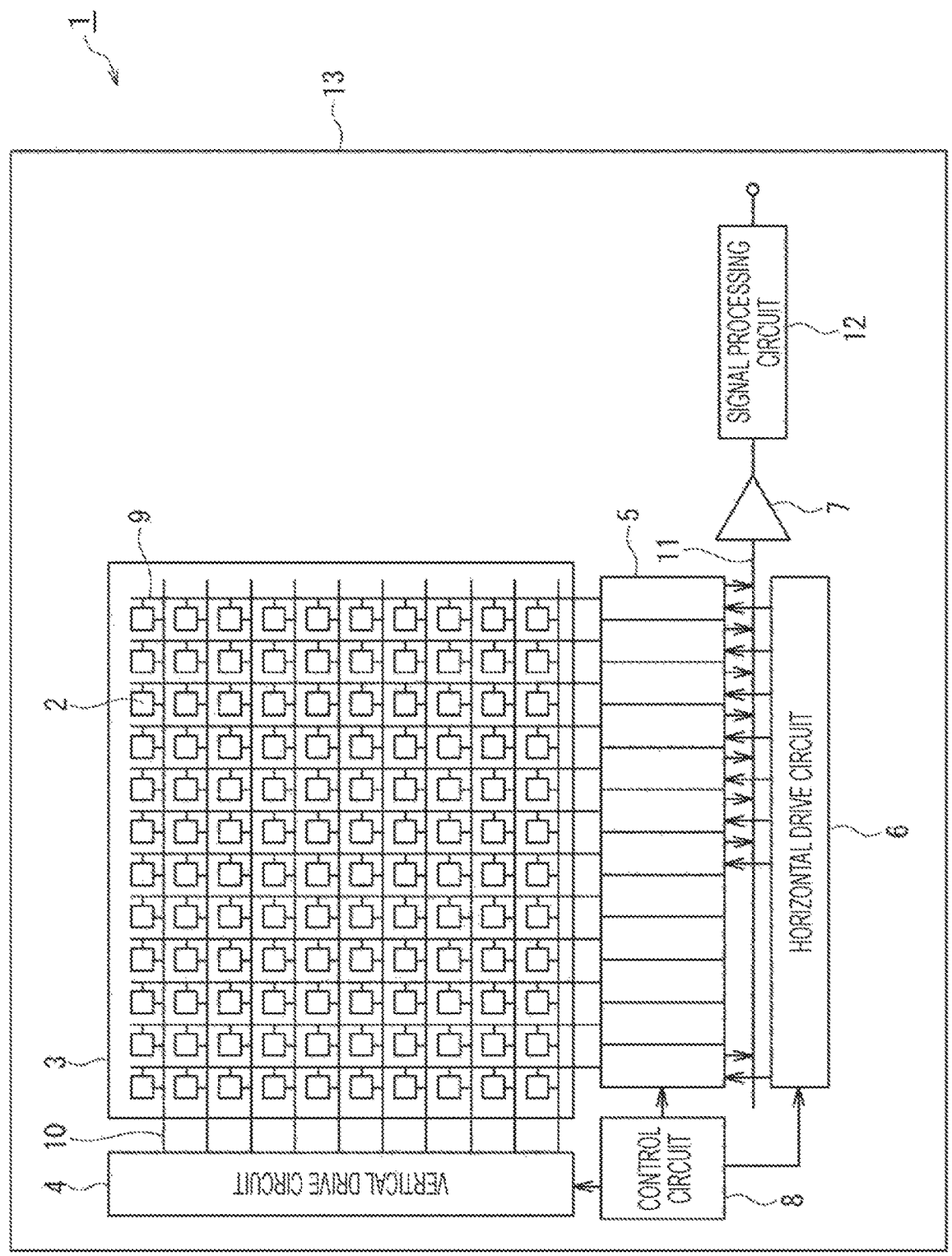
FIG. 1 is a diagram illustrating a schematic configuration of a solid state imaging device according to the present disclosure.

FIG. 1 is a diagram illustrating a schematic configuration of a solid state imaging device according to the present disclosure.

The solid state imaging device 1 in FIG. 1 includes, as a semiconductor, a semiconductor substrate 13 made of, for example, silicon (Si). The semiconductor substrate 13 has a pixel array unit 3 in which a plurality of pixels 2 is arrayed in a matrix, and a peripheral circuit unit on the periphery of the pixel array unit 3. The peripheral circuit unit includes a vertical drive circuit 4, a column signal processing circuit 5, a horizontal drive circuit 6, a buffer circuit 7, and a control circuit 8 or the like.

The pixel 2 includes a photodiode as a photoelectric conversion unit, and a plurality of pixel transistors. The plurality of pixel transistors, for example, is MOS transistors such as a transfer transistor, an amplification transistor, a selection transistor, and a reset transistor. An exemplary configuration of the pixel 2 will be described later with reference to FIG. 2.

The vertical drive circuit 4 includes, for example, a shift register. The vertical drive circuit 4 selects pixel drive wiring 10, supplies a pulse for driving the pixels 2 to the selected pixel drive wiring 10, and drives the pixels 2 in units of rows. Specifically, the vertical drive circuit 4 selectively and sequentially scans the pixels 2 of the pixel array unit 3 in units of rows in a vertical direction, and supplies, to the column signal processing circuit 5 through a vertical signal line 9, a pixel signal that is based on a signal charge generated in accordance with an incident light amount in the photoelectric conversion unit of each pixel 2.

The column signal processing circuit 5 is arranged for each column of the pixels 2, and performs, on a signal output from a row of the pixels 2, a signal process such as noise elimination for each pixel column. For example, the column signal processing circuit 5 performs a signal process such as correlated double sampling (CDS) for eliminating fixed pattern noise unique to a pixel, and AD conversion.

The horizontal drive circuit 6 includes, for example, a shift register. The horizontal drive circuit 6 sequentially outputs horizontal scanning pulses to select the column signal processing circuits 5 in order, and causes each of the column signal processing circuits 5 to output a pixel signal to a horizontal signal line 11.

The buffer circuit 7 buffers signals sequentially supplied from the respective column signal processing circuits 5 through the horizontal signal line 11, and outputs the buffered signals to the signal processing circuit 12.

The control circuit 8 receives an input clock and data for instructing an operation mode or the like, and outputs data such as internal information of the solid state imaging device 1. Specifically, the control circuit 8 generates a clock signal and a control signal on the basis of a vertical synchronizing signal, a horizontal synchronizing signal, and a master clock. The clock signal and the control signal serve as a standard for operation of the vertical drive circuit 4, the column signal processing circuit 5, and the horizontal drive circuit 6 or the like. Then, the control circuit 8 then outputs the generated clock signal and control signal to the vertical drive circuit 4, the column signal processing circuit 5, and the horizontal drive circuit 6 or the like.

The signal processing circuit 12 performs various digital signal processes on a digital pixel signal supplied from the buffer circuit 7. In the present embodiment, the signal processing circuit 12 executes a dynamic range expansion process and a sensitivity difference correction process which will be described later. The signal processing circuit 12 can also perform other digital signal processes such as, for example, column variation correction.

The solid state imaging device 1 configured as described above is a CMOS image sensor called a column AD type in which the column signal processing circuit 5 that performs the CDS process and the AD conversion process is arranged for each pixel column.

<2. Exemplary Circuit Configuration of Pixel 2>

Figure 2:
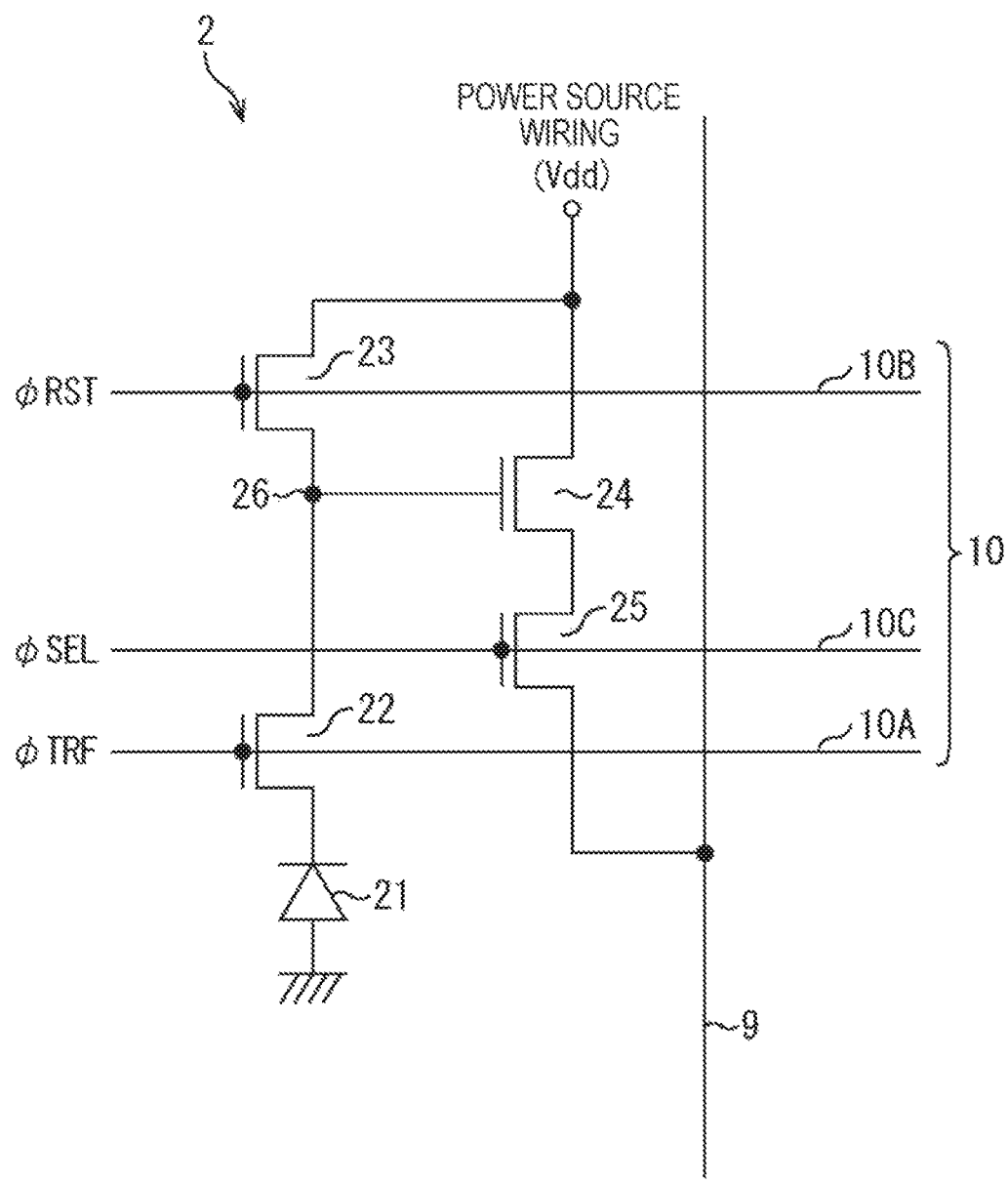
FIG. 2 is a diagram illustrating an exemplary circuit configuration of a pixel.

FIG. 2 is a diagram illustrating an exemplary circuit configuration of the pixel 2.

The pixel 2 has, as illustrated in FIG. 2, a photodiode (PD) 21 as a photoelectric conversion element and four transistors including a transfer transistor 22, a reset transistor 23, an amplification transistor 24, and a selection transistor 25.

In the present embodiment, for example, n-channel MOS transistors are used as the four transistors including the transfer transistor 22, the reset transistor 23, the amplification transistor 24, and the selection transistor 25. Note that the exemplified combinations of the conduction types of the transfer transistor 22, the reset transistor 23, the amplification transistor 24, and the selection transistor 25 are only examples and not limited to these combinations.

For the pixel 2, as the pixel drive wiring 10, three lines of drive wiring including a transfer line 10A, a reset line 10B, and a selection line 10C are wired in common with the pixels in the same pixel row. One end of each of the transfer line 10A, the reset line 10B, and the selection line 10C is connected to an output terminal corresponding to each pixel row of the vertical drive circuit 4 in units of pixel rows.

The photodiode 21 is configured such that an anode electrode is connected to a negative side power source (for example, GND). The photodiode 21 photoelectrically converts received light into a photocharge having a change amount that depends on a light amount of the received light (in the present embodiment, photoelectron).

A cathode electrode of the photodiode 21 is electrically coupled to a gate electrode of the amplification transistor 24 via the transfer transistor 22. A node electrically linked to the gate electrode of the amplification transistor 24 is referred to as a floating diffusion (FD) unit 26.

The transfer transistor 22 is connected between the cathode electrode of the photodiode 21 and the FD unit 26. To a gate electrode of the transfer transistor 22, such a transfer pulse $\phi$TRF that a high level (for example, Vdd level) is active (hereinafter referred to as "high active") is provided through the transfer line 10A. When the transfer pulse $\phi$TRF is provided, the transfer transistor 22 is turned on and transfers a photocharge photoelectrically converted in the photodiode 21 to the FD unit 26.

The reset transistor 23 is configured such that a drain electrode and a source electrode are respectively connected to a pixel power source Vdd and the FD unit 26. To a gate electrode of the reset transistor 23, a high active reset pulse $\phi$RST is provided through the reset line 10B before a signal charge is transferred from the photodiode 21 to the FD unit 26. When the reset pulse $\phi$RST is provided, the reset transistor 23 is turned on and discards a charge of the FD unit 26 to the pixel power source Vdd to reset the FD unit 26.

The amplification transistor 24 is configured such that the gate electrode and a drain electrode are respectively connected to the FD unit 26 and the pixel power source Vdd. Then, the amplification transistor 24 outputs, as a reset signal (reset level) Vreset, a potential of the FD unit 26 reset by the reset transistor 23. The amplification transistor 24 outputs, as a light accumulation signal (signal level) Vsig, a potential of the FD unit 26 to which a signal charge has been transferred by the transfer transistor 22.

The selection transistor 25 is configured such that, for example, a drain electrode and a source electrode are respectively connected to a source electrode of the amplification transistor 24 and the vertical signal line 9. To a gate electrode of the selection transistor 25, a high active selection pulse $\phi$SEL is provided through the selection line 10C. When the selection pulse $\phi$SEL is provided, the selection transistor 25 is turned on, causes the pixel 2 to be selected, and relays a signal output from the amplification transistor 24 to the vertical signal line 9.

Note that the selection transistor 25 can have such a circuit configuration that the selection transistor 25 is connected between the pixel power source Vdd and the drain of the amplification transistor 24.

In addition, the pixel 2 is not limited to the pixel 2 having the pixel configuration including the four transistors configured as described above. For example, the pixel 2 may have a pixel configuration including three transistors in which the amplification transistor 24 further serves as the selection transistor 25, regardless of a configuration of its pixel circuit.

<Exemplary Configuration of Microlens>

Figure 3:
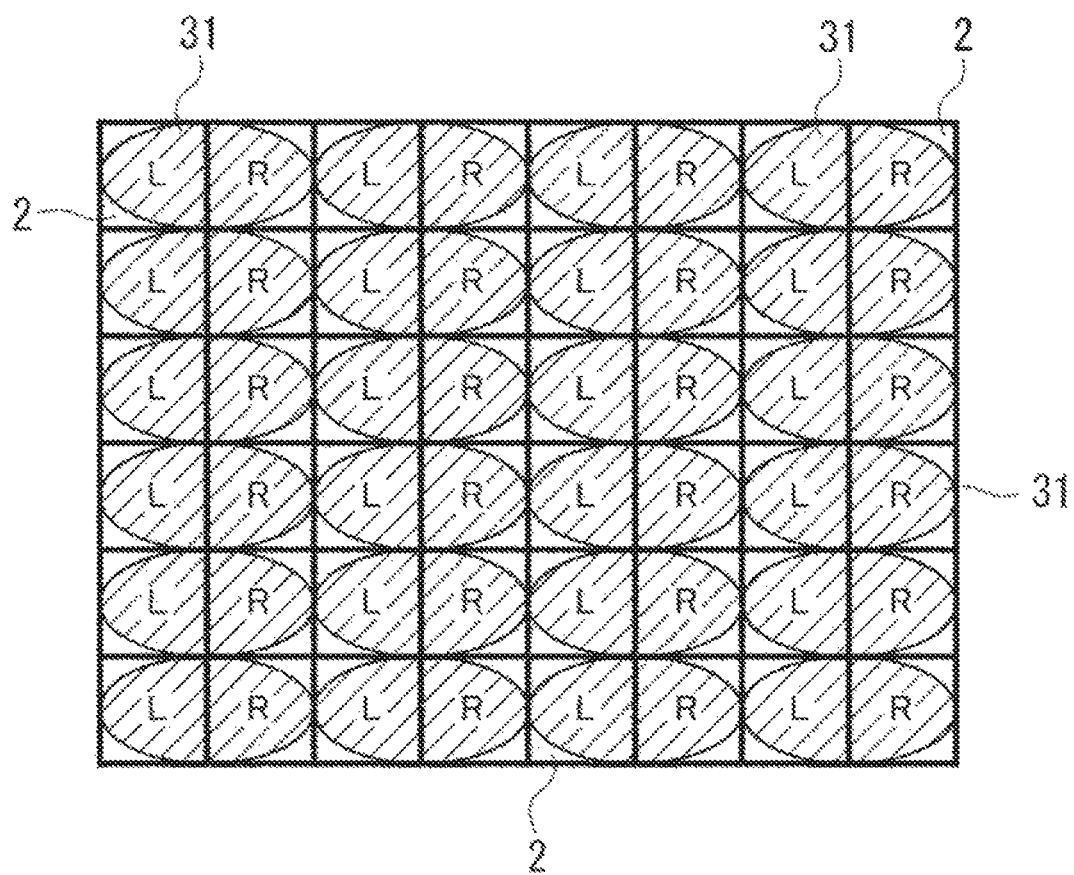
FIG. 3 is a diagram illustrating an exemplary configuration of a microlens within a pixel array unit.

FIG. 3 is a diagram illustrating an exemplary configuration of a microlens within the pixel array unit 3.

In the pixel array unit 3 of the solid state imaging device 1, the microlens (on-chip microlens) 31 is formed to be shared by a plurality of adjacent pixels. The microlens 31 collects incident light and causes it to enter the photodiode 21 of the pixel 2. In the present embodiment, as illustrated in FIG. 3, a single microlens 31 is formed to be shared by two pixels in a horizontal (left and right) direction.

Hereinafter, among the two pixels 2 that share the single microlens 31, the right pixel 2 and the left pixel 2 are also referred to as an R pixel and an L pixel, respectively.

In the present embodiment, as illustrated in FIG. 3, the single microlens 31 is formed to be shared by the two pixels in the horizontal (left and right) direction. In practice, however, as illustrated in FIGS. 4A-B, the microlens 31 is arranged to be displaced in the horizontal direction with respect to a light receiving region of the photodiode 21 of the semiconductor substrate 13 below the microlens 31.

Figure 4A:
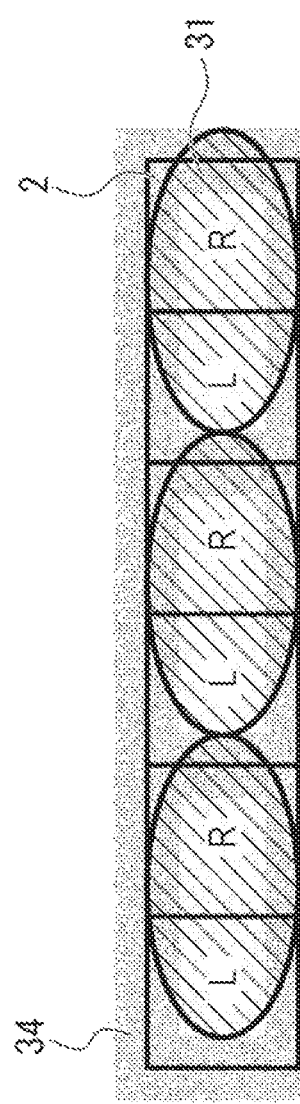
FIG. 4A and FIG. 4B are diagrams illustrating a pixel structure of the solid state imaging device.
Figure 4B:
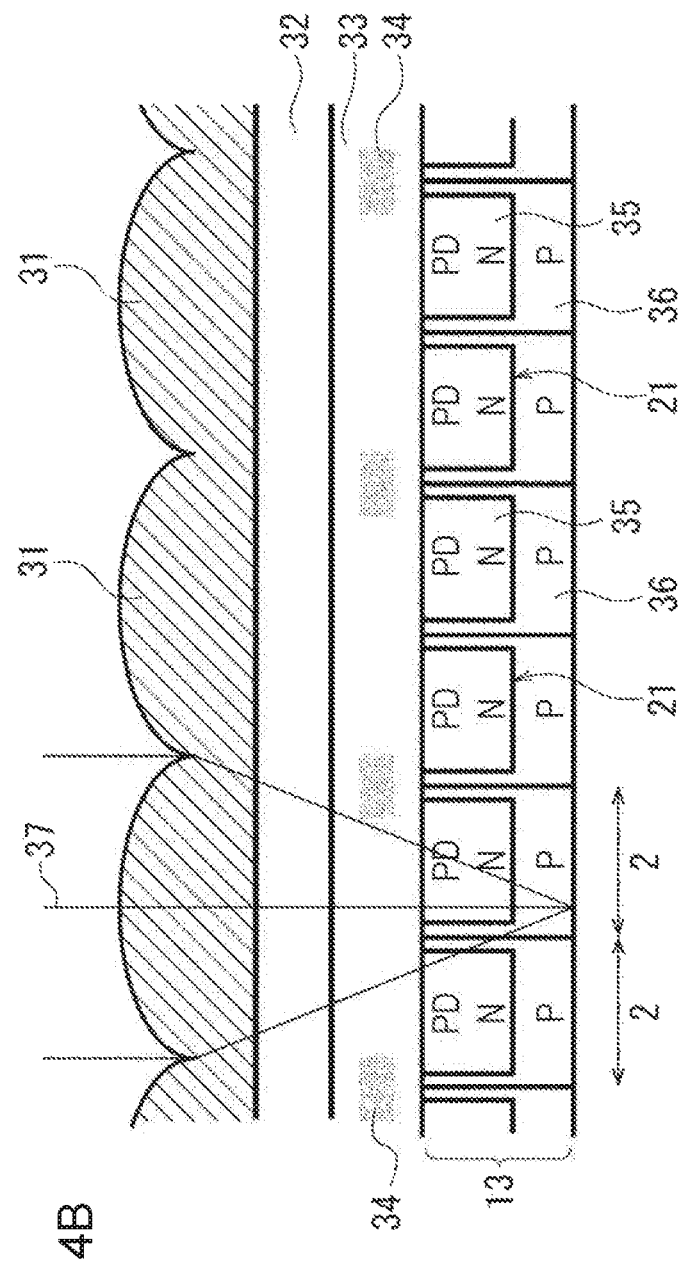

FIGS. 4A and 4B are diagrams illustrating the actual arrangement of the microlens 31 in the solid state imaging device 1. FIG. 4A is a schematic top diagram of six pixels in the horizontal direction corresponding to three microlenses 31. FIG. 4B is a schematic cross-sectional diagram of the six pixels in the horizontal direction.

In the solid state imaging device 1, as illustrated in FIG. 4B, for example, an n-type (second conduction type) semiconductor region 35 is formed in a p-type (first conduction type) semiconductor region 36 for each pixel on the semiconductor substrate 13. In this manner, the photodiodes 21 are formed in units of pixels. An area of a portion (light receiving region) of the n-type semiconductor region 35 facing the microlens 31 is formed to be the same in each pixel 2. In FIG. 4B, the p-type semiconductor region 36 is divided for each pixel. However, the p-type semiconductor region 36 is divided only for the purpose of convenience, and not divided for each pixel in practice. The same applies to boundaries of the pixels 2 in FIG. 4A.

On a surface side of the semiconductor substrate 13 (lower side in the drawing), a plurality of pixel transistors and a multilayer wiring layer are formed (neither of which is illustrated). The plurality of pixel transistors, for example, reads a charge accumulated in the photodiode 21. The multilayer wiring layer includes a plurality of wiring layers and interlayer insulation films.

On an upper surface on a back side of the semiconductor substrate 13 (upper side in the drawing), for example, an insulation layer (antireflection film) 33 made of a silicon oxide film or the like is formed. A light shielding film 34 is formed in a part of the insulation layer 33. As illustrated in FIGS. 4A and 4B, the light shielding film 34 is formed to have a predetermined width in a region of boundaries of the microlenses 31 and boundaries of the pixels. The light shielding film 34 only needs to be made of a material that shields light. Desirably, the light shielding film 34 is made of a material having a strong light-shielding property and capable of being subjected to fine processing, i.e., for example, capable of being etched and accurately processed. The light shielding film 34 can be formed of a film of metal such as, for example, tungsten (W), aluminum (Al), copper (Cu), titanium (Ti), molybdenum (Mo), and nickel (Ni).

A color filter 32 of red, green, or blue is formed on the insulation layer 33. The microlens 31 is formed on the color filter 32. The microlens 31 is formed of a resin-based material such as, for example, a styrene-based resin, an acrylic-based resin, a styrene-acryl copolymer-based resin, or a siloxane-based resin.

The pixel 2 configured as described above is formed in such a manner that an optical axis (lens center) 37 of the microlens 31 is displaced from a pixel region center of a plurality of pixels that receives incident light that has passed through the optical axis 37. More specifically, as illustrated in FIGS. 4A and 4B, the optical axis 37 of the microlens 31 is formed to be displaced to a right side (close to R pixel) with respect to the pixel region center of the corresponding plurality of pixels.

Note that the displacement of the formation position of the microlens 31 with respect to the light receiving region of the pixels 2 may be generated intentionally or generated unintentionally. In other words, in the present embodiment, it does not matter which factor has generated the displacement of the formation position of the microlens 31.

Due to the displacement of the formation position of the microlens 31, a sensitivity difference occurs in the plurality of pixels 2 that receives incident light that has passed through the single microlens 31.

<Explanation of Sensitivity Difference>

Figure 5:
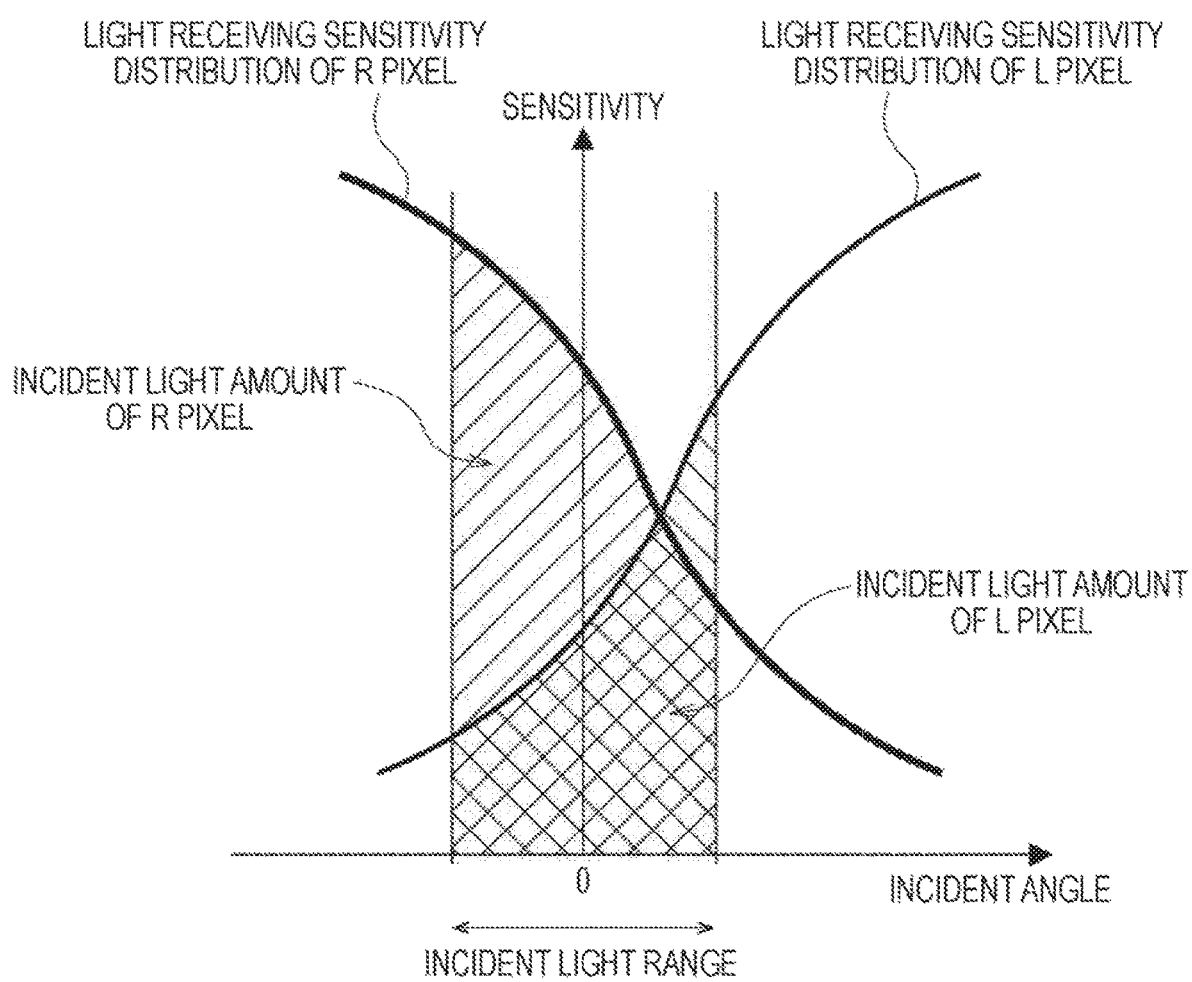
FIG. 5 is a diagram explaining a sensitivity difference that occurs in an L pixel and an R pixel.

The sensitivity difference that occurs in the L pixel and the R pixel will be described with reference to FIG. 5. FIG. 5 is a diagram illustrating a light receiving sensitivity distribution of each of the L pixel and the R pixel.

The light receiving sensitivity distribution is a sensitivity characteristic graph that represents sensitivity to an incident angle, assuming that a horizontal axis is an incident angle of incident light and a vertical axis is light receiving sensitivity.

As illustrated in FIGS. 4A-4B, when the optical axis 37 of the microlens 31 is displaced to be close to the R pixel with respect to the pixel region center of the plurality of pixels, an intersection of the light receiving sensitivity distribution of the L pixel and the light receiving sensitivity distribution of the R pixel is shifted to the right side of a position of an incident angle 0° as illustrated in FIG. 5.

An incident light amount that enters the L pixel corresponds to an area of the light receiving sensitivity distribution of the L pixel within a range of the incident angle of incident light that enters the L pixel. An incident light amount that enters the R pixel corresponds to an area of the light receiving sensitivity distribution of the R pixel within a range of the incident angle of incident light that enters the R pixel. Therefore, the L pixel is a low-sensitivity pixel having a smaller incident light amount than the R pixel, and the R pixel is a high-sensitivity pixel having a larger incident light amount than the L pixel, whereby the sensitivity difference occurs in the L pixel and the R pixel.

As described above, when the optical axis 37 of the microlens 31 is formed to be displaced with respect to the pixel region center of the corresponding plurality of pixels, the sensitivity difference occurs in the plurality of pixels.

Therefore, the signal processing circuit 12 of the solid state imaging device 1 is configured to perform signal processes (image processes) illustrated in FIGS. 6 and 7 on an image in which the sensitivity difference occurs.

<Explanation of First Signal Process>

FIG. 6 is a diagram explaining a first signal process that is performed by the signal processing circuit 12.

The signal processing circuit 12 obtains an image 41 supplied from the buffer circuit 7. The image 41 is an image captured by a low-sensitivity pixel and a high-sensitivity pixel, namely, the L pixel and the R pixel of the pixel array unit 3 having different degrees of sensitivity.

The signal processing circuit 12 then executes a dynamic range expansion process on the basis of pixel signals of the low-sensitivity pixel and the high-sensitivity pixel of the image 41, and generates and outputs an image 42 with an expanded dynamic range.

<Explanation of Second Signal Process>

FIG. 7 is a diagram explaining a second signal process that is performed by the signal processing circuit 12.

The signal processing circuit 12 generates, from an image supplied from the buffer circuit 7, two images 43L and 43R having different degrees of sensitivity, that is, a low-sensitivity image 43L including only the low-sensitivity pixels and a high-sensitivity image 43R including only the high-sensitivity pixels.

The signal processing circuit 12 then performs a sensitivity difference correction process for correcting the difference in the sensitivity on the low-sensitivity image 43L and the high-sensitivity image 43R, and outputs corrected images 44L and 44R obtained as the result of the sensitivity difference correction process.

The two corrected images 44L and 44R are used as, for example, images for causing a user to perceive three dimensions.

<Block Diagram of Detailed Configuration of Signal Processing Circuit>

Figure 8:
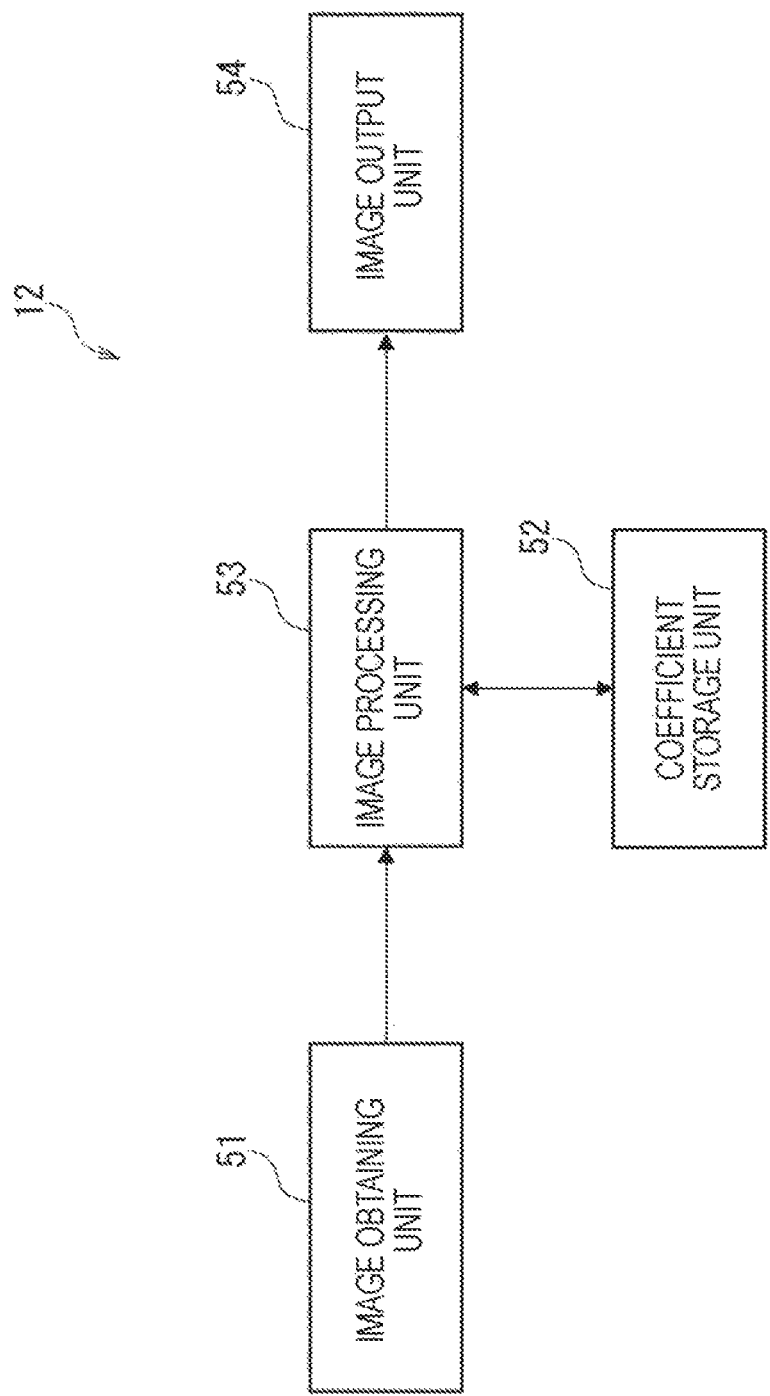
FIG. 8 is a block diagram illustrating a detailed configuration of the signal processing circuit.

FIG. 8 is a block diagram illustrating a detailed configuration of the signal processing circuit 12.

The signal processing circuit 12 includes an image obtaining unit 51, a coefficient storage unit 52, an image processing unit 53, and an image output unit 54.

The image obtaining unit 51 obtains an image including a plurality of pixel values (pixel signals) having different degrees of sensitivity supplied from the buffer circuit 7, and supplies the image to the image processing unit 53.

The coefficient storage unit 52 stores, as sensitivity difference information, a sensitivity ratio between the high-sensitivity pixel and the low-sensitivity pixel of the pixel array unit 3 obtained in advance. The sensitivity ratio can be obtained on the basis of image data of a predetermined image (for example, image with uniform brightness) captured in advance, and stored in the coefficient storage unit 52. Alternatively, when the displacement of the formation position of the microlens 31 has been intentionally formed, the sensitivity ratio between the high-sensitivity pixel and the low-sensitivity pixel may be obtained from a ratio of an amount of received light calculated from an amount of displacement, and stored in the coefficient storage unit 52.

The image processing unit 53 executes the dynamic range expansion process described with reference to FIG. 6 as the first signal process using the sensitivity ratio obtained from the coefficient storage unit 52.

In addition, the image processing unit 53 also executes the sensitivity difference correction process described with reference to FIG. 7 as the second signal process using the sensitivity ratio obtained from the coefficient storage unit 52.

Note that, in the present embodiment, the image processing unit 53 can execute both the dynamic range expansion process and the sensitivity difference correction process selectively or simultaneously. However, the image processing unit 53 may be configured to execute only one of either the dynamic range expansion process or the sensitivity difference correction process.

The image output unit 54 outputs a processed image subjected to the process in the image processing unit 53, namely, the image 42 with the expanded dynamic range or the corrected images 44L and 44R with the corrected sensitivity difference.

<Explanation of Dynamic Range Expansion Process>

The dynamic range expansion process will be further described with reference to FIGS. 9 to 11.

Figure 9:
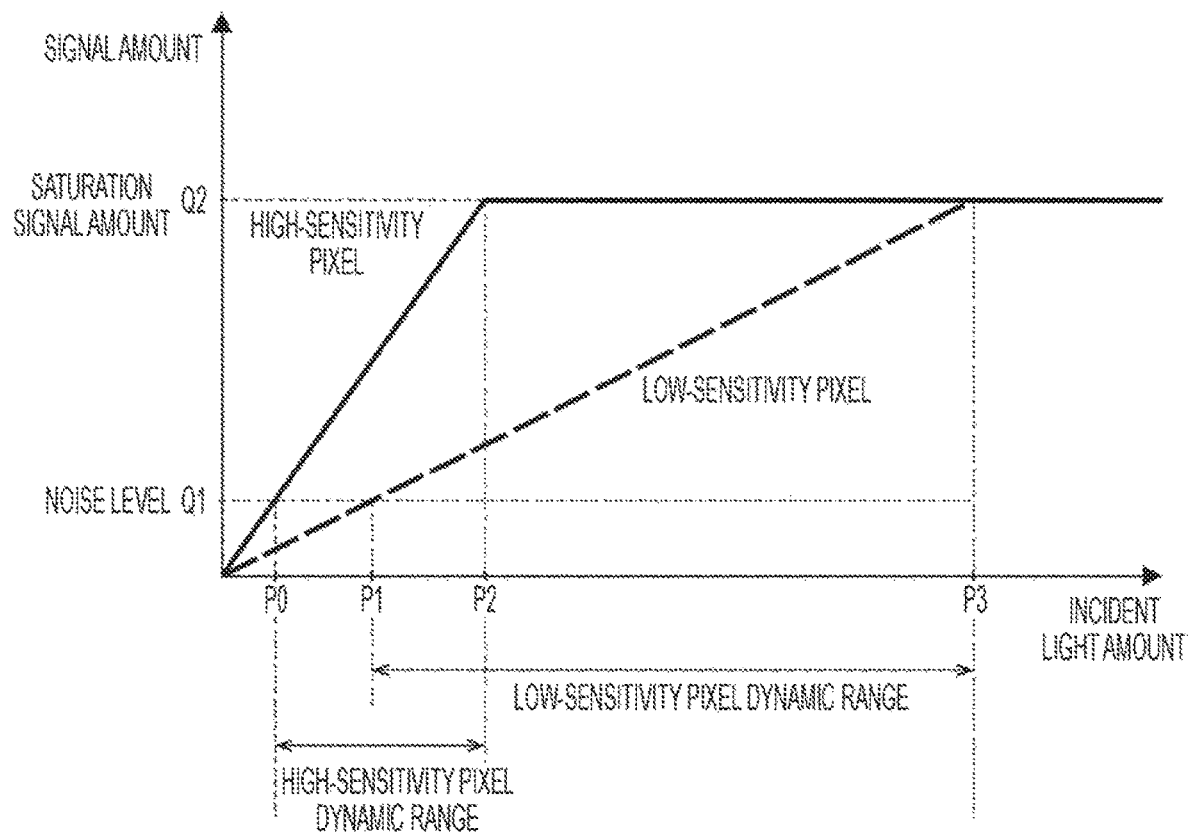
FIG. 9 is a diagram explaining a dynamic range expansion process.

FIG. 9 is a diagram illustrating a relation between the incident light amount and a signal amount in each of the low-sensitivity pixel and the high-sensitivity pixel. Note that, in FIG. 9, exposure times for the low-sensitivity pixel and the high-sensitivity pixel are identically set.

The high-sensitivity pixel reaches a saturation signal amount Q2 at a point of time when the incident light amount becomes P2, and the low-sensitivity pixel reaches the saturation signal amount Q2 at a point of time when the incident light amount becomes P3. On the other hand, when the signal amount obtained by the light reception is Q1 or less, the signal amount corresponds to a noise level, and its pixel signal cannot be utilized. The dynamic range of the high-sensitivity pixel, therefore, is a range of the incident light amount from P0 to P2, and the dynamic range of the low-sensitivity pixel is a range of the incident light amount from P1 to P3.

Figure 10:
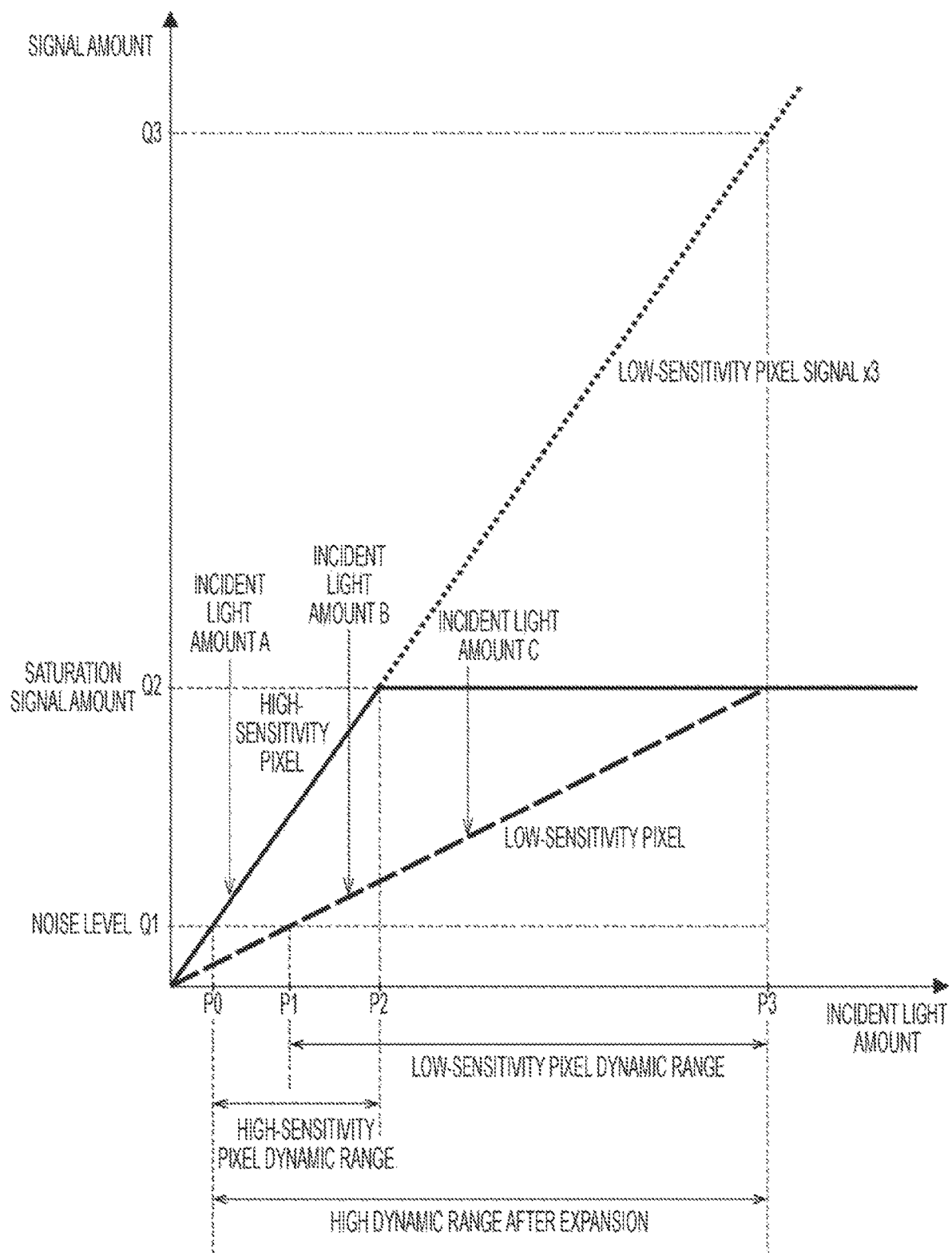
FIG. 10 is a diagram explaining the dynamic range expansion process.

FIG. 10 is a diagram illustrating a relation between the incident light amount and the signal amount obtained by the dynamic range expansion process.

Now, assuming that the sensitivity ratio between the low-sensitivity pixel and the high-sensitivity pixel is 1:3 (low-sensitivity pixel:high-sensitivity pixel=1:3), for example, for the pixel 2 at an incident light amount A, the image processing unit 53 obtains a pixel signal $HDL\_A$ after the dynamic range expansion process by means of the following Formula (1).

$$\text{Pixel signal } HDL\_A = \text{High-sensitivity pixel signal} \times 1 + \text{Low-sensitivity pixel signal} \times 0 \quad (1)$$

In addition, for the pixel 2 at an incident light amount B, the image processing unit 53 obtains a pixel signal $HDL\_B$ after the dynamic range expansion process by means of the following Formula (2).

$$\text{Pixel signal } HDL\_B = \text{High-sensitivity pixel signal} \times (1-\alpha) + \text{Low-sensitivity pixel signal} \times \alpha \times 3 \quad (2)$$

Furthermore, for the pixel 2 at an incident light amount C, the image processing unit 53 obtains a pixel signal $HDL\_C$ after the dynamic range expansion process by means of the following Formula (3).

$$\text{Pixel signal } HDL\_C = \text{High-sensitivity pixel signal} \times 0 + \text{Low-sensitivity pixel signal} \times 3 \quad (3)$$

As described above, the image processing unit 53 classifies the signal amount (incident light amount) of each pixel 2 of the pixel array unit 3 into, for example, three including a low level, a middle level, and a high level. The image processing unit 53 then obtains, for the pixel 2 with the low-level signal amount, the pixel signal after the dynamic range expansion process by means of Formula (1) that uses only the pixel signal of the high-sensitivity pixel.

In addition, for the pixel 2 with the middle-level signal amount, the image processing unit 53 obtains the pixel signal after the dynamic range expansion process by means of Formula (2) that combines the pixel signals of the high-sensitivity pixel and the low-sensitivity pixel signal in the ratio of $(1-\alpha):\alpha$. Here, $\alpha$ ($\alpha$ is 0 or more and 1 or less) represents a combination ratio.

Furthermore, for the pixel 2 with the high-level signal amount, the image processing unit 53 obtains the pixel signal after the dynamic range expansion process by means of Formula (3) that uses only the low-sensitivity pixel signal.

Consequently, as illustrated in FIG. 10, it is possible to generate an image with a high dynamic range, the signal amount of which has been expanded from Q1 to Q3.

Note that the classification of the signal amount level into the low level, the middle level, and the high level is determined in advance.

In addition, the above-mentioned example has described a case where the exposure times for the low-sensitivity pixel and the high-sensitivity pixel are identical. As illustrated in FIG. 11, however, it is also possible to perform capturing while the exposure time for the low-sensitivity pixel is set shorter than that for the high-sensitivity pixel, and generate an image with a high dynamic range from the image obtained as the result of the capturing.

Figure 11:
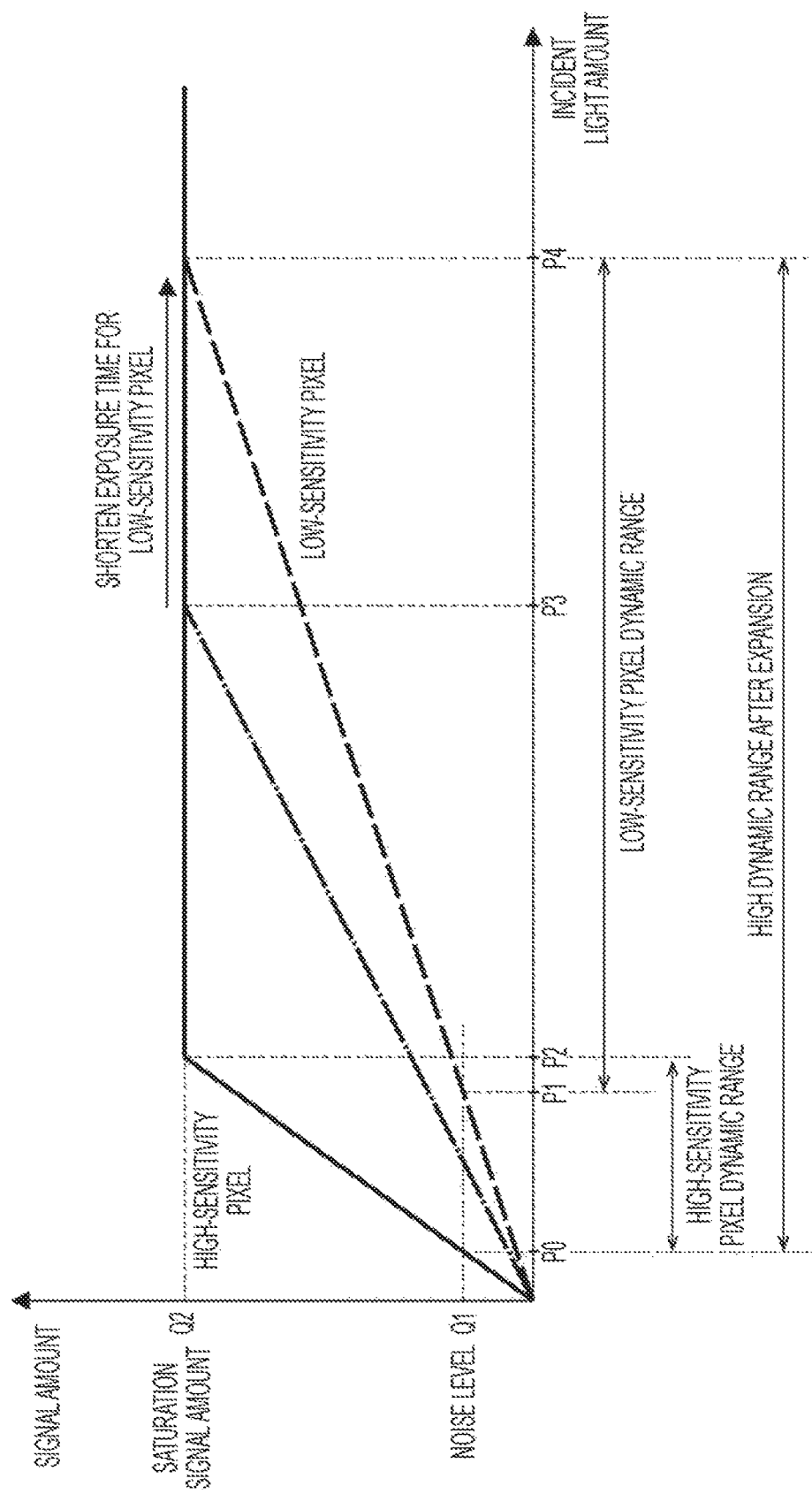
FIG. 11 is a diagram explaining the dynamic range expansion process.

In FIG. 11, when the exposure time for the low-sensitivity pixel is identical to the exposure time for the high-sensitivity pixel, the incident light amount that reaches the saturation signal amount Q2 is P3. When the exposure time for the low-sensitivity pixel is set shorter than that for the high-sensitivity pixel, the incident light amount that reaches the saturation signal amount Q2 is P4 (>P3).

In order to vary the exposure times for the low-sensitivity pixel and the high-sensitivity pixel as described above, for example, the image processing unit 53 outputs, to the control circuit 8, a control signal for setting the exposure times for the low-sensitivity pixel and the high-sensitivity pixel to predetermined times, and the control circuit 8 further controls the vertical drive circuit 4 so that the designated exposure times are achieved. Alternatively, the control signal for setting the exposure times for the low-sensitivity pixel and the high-sensitivity pixel to the predetermined times may be input from a signal processing circuit or the like outside the solid state imaging device 1.

Note that the high dynamic range can also be realized by prolonging the exposure time for the high-sensitivity pixel instead of setting the exposure time for the low-sensitivity pixel shorter than that for the high-sensitivity pixel. In addition, the exposure times for both the low-sensitivity pixel and the high-sensitivity pixel may be changed.

<Explanation of Sensitivity Difference Correction Process>

Next, the sensitivity difference correction process will be described with reference to FIGS. 12 and 13.

Figure 12:
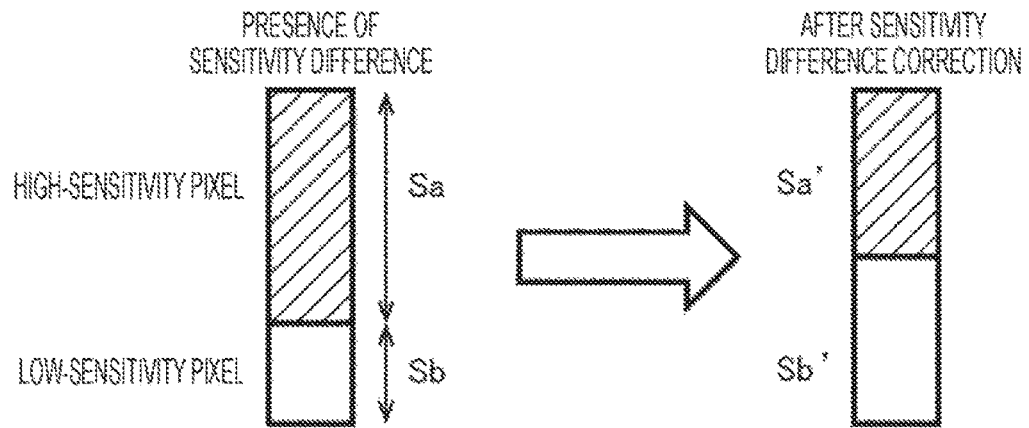
FIG. 12 is a diagram explaining a sensitivity difference correction process.

As illustrated in FIG. 12, the sensitivity difference correction process is a process that is performed when a signal amount Sa of the high-sensitivity pixel and a signal amount Sb of the low-sensitivity pixel are different due to a difference in the incident light amount that has occurred as the result of the displacement of the formation position of the microlens 31. In this case, by means of the sensitivity difference correction process, the signal amount of the high-sensitivity pixel is corrected to Sa' and the signal amount of the low-sensitivity pixel is corrected to Sb' so that the signal amounts become identical.

Figure 13:
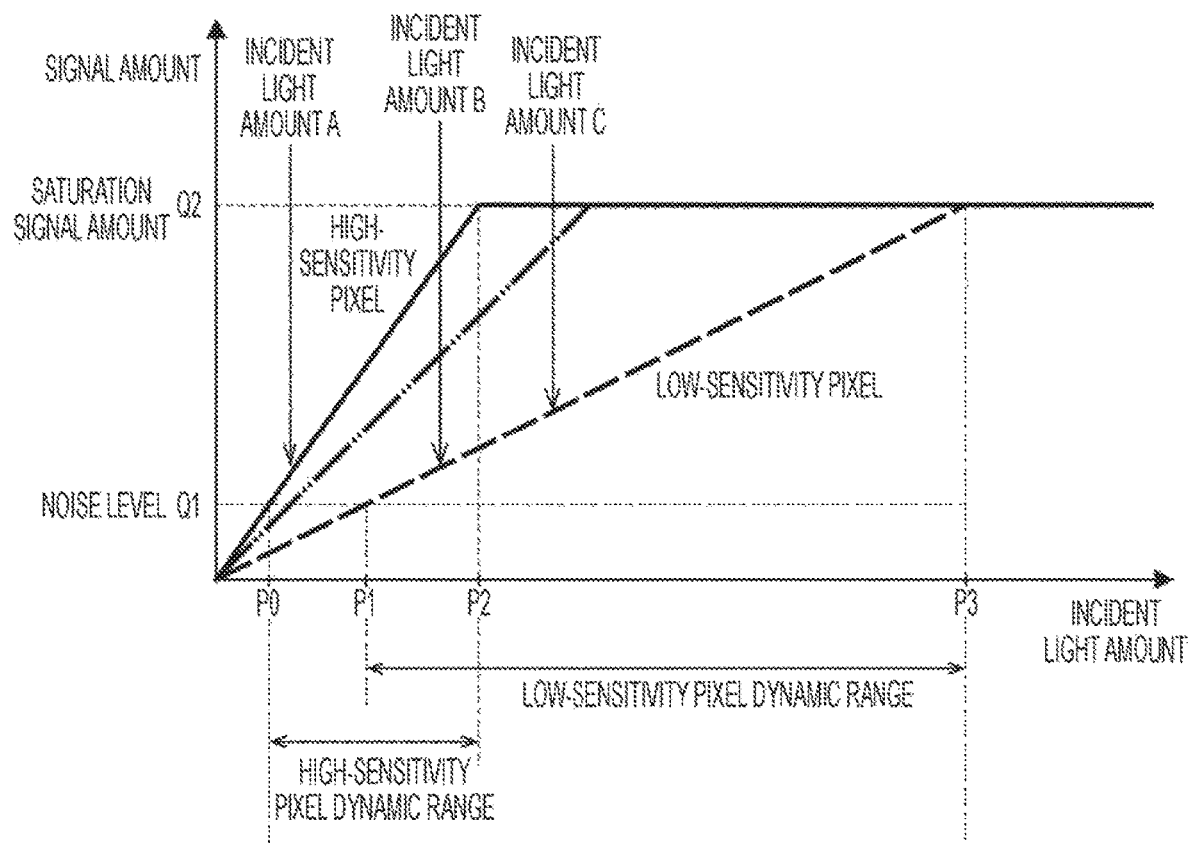
FIG. 13 is a diagram explaining the sensitivity difference correction process.

FIG. 13 is a diagram illustrating a relation between the incident light amount and the signal amount obtained by the sensitivity difference correction process.

In a similar way to the above-mentioned example, assuming that the sensitivity ratio between the low-sensitivity pixel and the high-sensitivity pixel is 1:3 (low-sensitivity pixel:high-sensitivity pixel=1:3), for example, respectively for the high-sensitivity pixel and the low-sensitivity pixel at the incident light amount A, the image processing unit 53 obtains a high-sensitivity pixel signal HS_A and a low-sensitivity pixel signal LS_A after the sensitivity difference correction by means of the following Formula (4).

High-sensitivity pixel signal HS_$A$=High-sensitivity pixel signal×$(2+\beta)/3$ Low-sensitivity pixel signal LS_$A$=Low-sensitivity pixel signal×$(2-\beta)$ (4)

In addition, respectively for the high-sensitivity pixel and the low-sensitivity pixel at the incident light amount B, the image processing unit 53 obtains a high-sensitivity pixel signal HS_B and a low-sensitivity pixel signal LS_B after the sensitivity difference correction by means of the following Formula (5).

High-sensitivity pixel signal HS_$B$=High-sensitivity pixel signal×$2/3$

Low-sensitivity pixel signal LS_$B$=Low-sensitivity pixel signal×$2$ (5)

Furthermore, respectively for the high-sensitivity pixel and the low-sensitivity pixel at the incident light amount C, the image processing unit 53 obtains a high-sensitivity pixel signal HS_C and a low-sensitivity pixel signal LS_C after the sensitivity difference correction by means of the following Formula (6).

High-sensitivity pixel signal HS_$C$=High-sensitivity pixel signal×$(2-\gamma)/3$ Low-sensitivity pixel signal LS_$C$=Low-sensitivity pixel signal×$(2+\gamma)$ (6)

As described above, the image processing unit 53 classifies the signal amount (incident light amount) of each pixel 2 of the pixel array unit 3 into, for example, three including a low level, a middle level, and a high level. The image processing unit 53 then obtains, for the pixel 2 with the low-level signal amount, the high-sensitivity pixel signal and the low-sensitivity pixel signal after the sensitivity difference correction by means of Formula (4).

In addition, for the pixel 2 with the middle-level signal amount, the image processing unit 53 obtains the high-sensitivity pixel signal and the low-sensitivity pixel signal after the sensitivity difference correction by means of Formula (5). Furthermore, for the pixel 2 with the high-level signal amount, the image processing unit 53 obtains the high-sensitivity pixel signal and the low-sensitivity pixel signal after the sensitivity difference correction by means of Formula (6). Here, $\beta$, in Formula (4) and $\gamma$ in Formula (6) are positive real numbers determined in advance, and adjustment coefficients for adjusting the sensitivity difference correction.

Consequently, the high-sensitivity pixel signal and the low-sensitivity pixel signal are corrected to image signals of the same level represented by a two-dot chain line in FIG. 13. Note that the classification of the signal amount level into the low level, the middle level, and the high level is determined in advance. In addition, the noise level and the level of the saturation signal amount are estimated from the signal amount of the low-sensitivity pixel.

<Process Flow of Dynamic Range Expansion Process>

Figure 14:
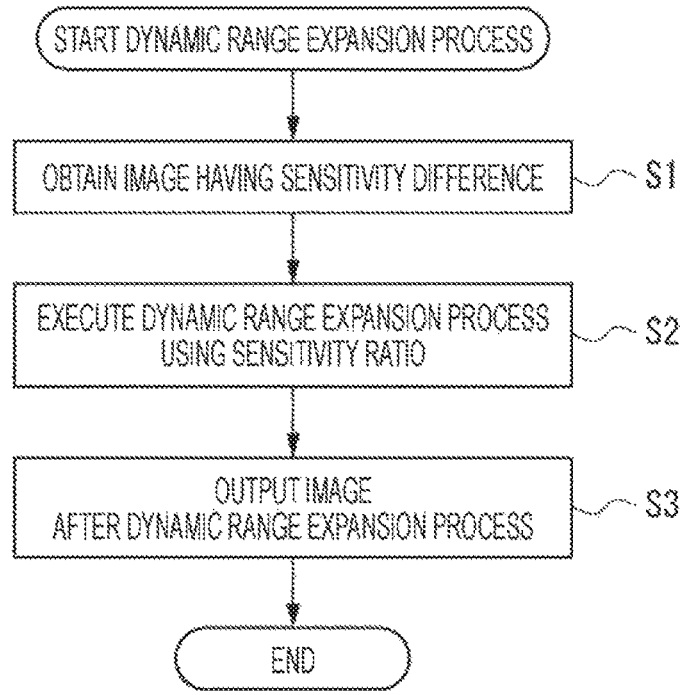
FIG. 14 is a flowchart explaining the dynamic range expansion process.

The dynamic range expansion process by the signal processing circuit 12 will be described with reference to a flowchart in FIG. 14.

First, in step S1, the image obtaining unit 51 obtains one image having the sensitivity difference supplied from the buffer circuit 7, and supplies the image to the image processing unit 53.

In step S2, the image processing unit 53 obtains the sensitivity ratio between the low-sensitivity pixel and the high-sensitivity pixel stored in the coefficient storage unit 52, and executes the dynamic range expansion process described with reference to FIGS. 9 to 11 using the obtained sensitivity ratio. The processed image is supplied to the image output unit 54.

In step S3, the image output unit 54 outputs the image after the dynamic range expansion process to the outside of the solid state imaging device 1.

The dynamic range expansion process for the one image captured in the pixel array unit 3 is executed in the above-described way. The signal processing circuit 12 can repeatedly execute the above-mentioned process for images (images having the sensitivity differences) sequentially supplied from the buffer circuit 7.

<Process Flow of Sensitivity Difference Correction Process>

Figure 15:
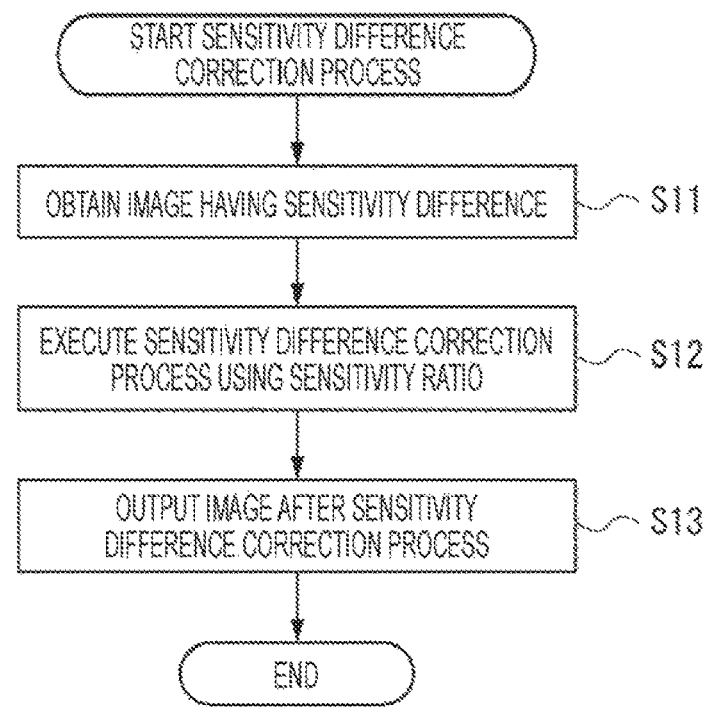
FIG. 15 is a flowchart explaining the sensitivity difference correction process.

Next, the sensitivity difference correction process by the signal processing circuit 12 will be described with reference to a flowchart in FIG. 15.

First, in step S11, the image obtaining unit 51 obtains one image having the sensitivity difference supplied from the buffer circuit 7, generates the low-sensitivity image including only the low-sensitivity pixels and the high-sensitivity image including only the high-sensitivity pixels, and supplies the low-sensitivity image and the high-sensitivity image to the image processing unit 53.

In step S12, the image processing unit 53 obtains the sensitivity ratio between the low-sensitivity pixel and the high-sensitivity pixel stored in the coefficient storage unit 52, and executes the sensitivity difference correction process described with reference to FIGS. 12 and 13 using the obtained sensitivity ratio. Each of the processed low-sensitivity image and high-sensitivity image is supplied to the image output unit 54.

In step S13, the image output unit 54 outputs each of the low-sensitivity image and the high-sensitivity image after the sensitivity difference correction process to the outside of the solid state imaging device 1.

The sensitivity difference correction process for the one image captured in the pixel array unit 3 is executed in the above-described way. The signal processing circuit 12 can repeatedly execute the above-mentioned process for images (images having the sensitivity differences) sequentially supplied from the buffer circuit 7.

In the dynamic range expansion process and the sensitivity difference correction process mentioned above, the sensitivity ratio between the low-sensitivity pixel and the high-sensitivity pixel is measured and stored in the coefficient storage unit 52 in advance, and a predetermined signal process (dynamic range expansion process and sensitivity difference correction process) is performed using the stored sensitivity ratio. However, the sensitivity ratio may be calculated in real time using the one image itself supplied from the buffer circuit 7, and the predetermined signal process may be executed using the calculated sensitivity ratio. In this case, although operation time increases since the sensitivity ratio needs to be calculated at each time point, the coefficient storage unit 52 can be omitted.

<Variation 1>

The above-mentioned embodiment has described an example in which the sensitivity difference occurs in the pixels 2 due to only the displacement of the formation position of the microlens 31 shared by the plurality of pixels 2 with respect to the light receiving region of the photodiode 21.

However, the technique of the present disclosure can also be applied to a case where the sensitivity difference occurs in the plurality of pixels 2 that shares the microlens 31 due to not only the formation position of the microlens 31 but also another structural difference.

FIGS. 16A-16B are diagrams illustrating an exemplary structure that causes the sensitivity difference to occur due to a difference in a light shielding film as well as the formation position of the microlens 31.

In the exemplary structure illustrated in FIGS. 16A-16B, a formation region of a light shielding film 71 is different from a formation region of the light shielding film 34 illustrated in FIGS. 4A-4B. More specifically, the light shielding film 71 is formed so as to cover the light receiving region of the L pixel more than that of the R pixel. In other words, an opening area of the light shielding film 71 above the light receiving region of the R pixel is formed larger than an opening area of the light shielding film 71 above the light receiving region of the L pixel. The other structures in FIGS. 16A-16B are similar to those in FIGS. 4A-4B.

Note that the difference in the formation region of the light shielding film 71 is also not limited to the intentional formation.

Therefore, the signal processing circuit 12 can perform the dynamic range expansion process and the sensitivity difference correction process based on the sensitivity difference due to the position displacement of the microlens 31 and the position displacement of the light shielding film 71 that have occurred whether intentionally or unintentionally.

<Variation 2>

Figure 17:
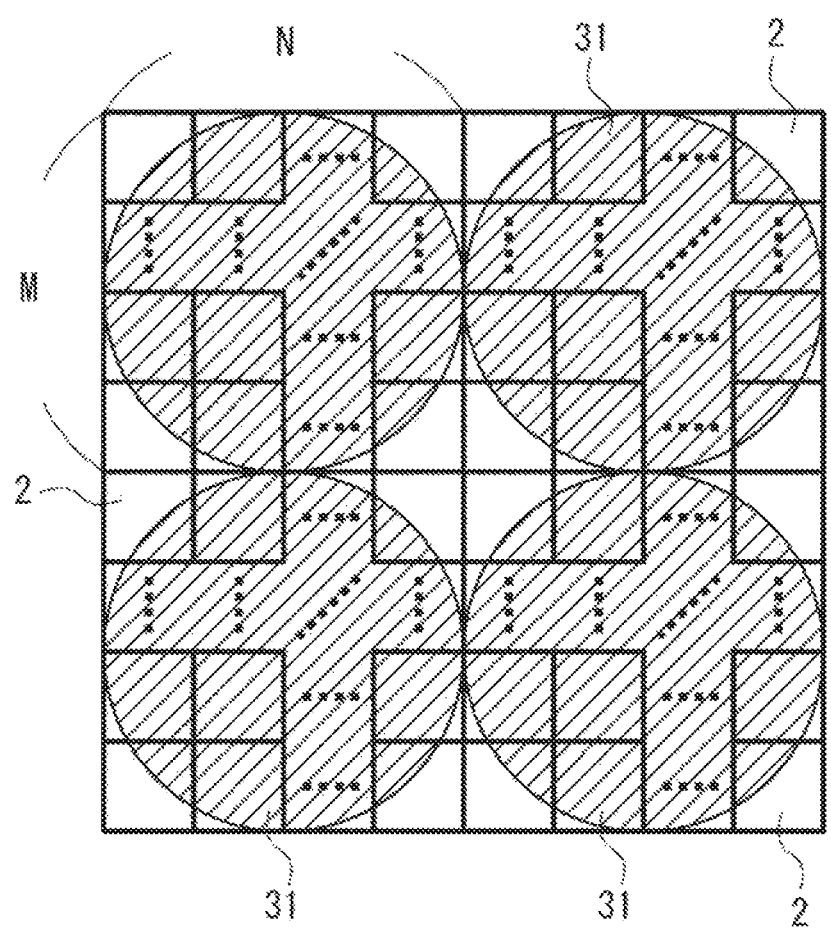
FIG. 17 is a diagram illustrating another exemplary configuration of the microlens.

In the above-mentioned embodiment, the microlens 31 is formed so that the two pixels in the horizontal direction are arranged for the single microlens 31. However, the number of pixels 2 that share the single microlens 31 is not limited to this example, and the single microlens 31 only needs to be shared by M×N (vertical direction×horizontal direction) pixels 2 as illustrated in FIG. 17. Here, M and N are integers of 1 or more, and at least one of M or N is a value greater than 1.

For example, when 4×4, that is, 16 pixels share the single microlens 31, an image having 16 kinds of light receiving sensitivity is obtained.

In the dynamic range expansion process, the image processing unit 53 multiplies a pixel signal of each pixel 2 within the same microlens by a coefficient (sensitivity ratio coefficient) that depends on the sensitivity of each pixel 2. Then, an image in which each pixel includes the multiplied pixel signal is output as an image with a high dynamic range.

In the sensitivity difference correction process, the image processing unit 53 generates, from one image generated in the pixel array unit 3, 16 images having different degrees of sensitivity. Each of the 16 images includes the pixels located at the same pixel position within the microlens 31. Next, the image processing unit 53 multiplies a pixel signal of each pixel 2 of each of the 16 images having different degrees of sensitivity by a coefficient (sensitivity difference correction coefficient) for correcting the sensitivity difference in the pixels 2. Then, 16 images in which each pixel includes the multiplied pixel signal are output as images after the sensitivity difference correction.

<Characteristics of HDR Image of Present Disclosure>

The above-mentioned embodiment has described a case where the sensitivity difference occurs due to the displacement of the formation position of the microlens 31 in the plurality of pixels 2 that receives incident light that has passed through the single microlens 31. In addition, the above-mentioned embodiment has also described both cases where the exposure times for the low-sensitivity pixel and the high-sensitivity pixel are identical and different.

Next, a case where the displacement of the formation position of the microlens 31 does not occur will be described.

Even when the displacement of the formation position of the microlens 31 does not occur, the low-sensitivity pixel and the high-sensitivity pixel can be realized by varying the exposure time for each of the plurality of pixels 2 that receives incident light that has passed through the single microlens 31, and an image with an expanded dynamic range (hereinafter referred to as a high dynamic range image (HDR image)) can be generated.

Hereinafter, a difference between an HDR image generated by the solid state imaging device 1 in which the two pixels 2 are arranged for the single microlens in the same way as the above-mentioned embodiment and an HDR image generated by an solid state imaging device in which a single pixel is arranged for a single microlens will be described.

Note that, in the following description, a pixel array in which the two pixels 2 are arranged for the single microlens is referred to as a single lens multi-pixel array, and a pixel array in which the single pixel is arranged for the single microlens is referred to as a single lens single pixel array.

Figure 18:
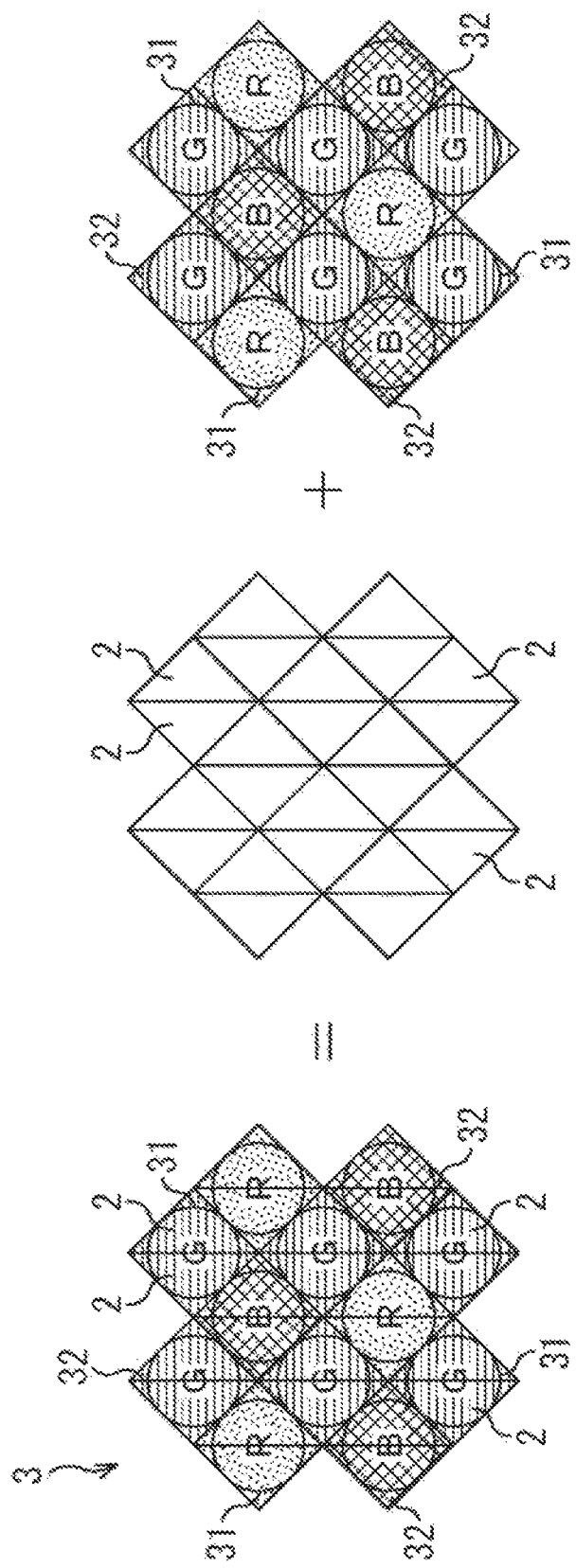
FIG. 18 is a diagram illustrating an example of a single lens multi-pixel array of the pixel array unit.

FIG. 18 is a diagram illustrating another example of the single lens multi-pixel array of the pixel array unit 3.

Note that FIG. 18 is the diagram illustrating a part of a region of the pixel array unit 3 separated into the pixel 2 and the microlens 31 with the color filter 32 for the purpose of explanation.

In the pixel array of FIG. 18, the microlenses 31 and the color filters 32 of red (R), green (G), or blue (B) are arrayed in a 45-degree oblique direction. The color filters 32 are arranged in a so-called Bayer array in which a combination of R, G, B, and G is repeated in units of adjacent four pixels in an array direction, namely, the oblique direction.

In addition, in the pixel array of FIG. 18, the two pixels 2 are arranged for the single microlens 31 and the color filter 32 of one color within a rhombic region rotated by 45 degrees so as to divide them into two halves in the horizontal direction.

Therefore, the pixel array illustrated in FIG. 18 is also the single lens multi-pixel array in which the two pixels 2 are arranged for the single microlens. Hereinafter, the pixel array illustrated in FIG. 18 is specifically referred to as a zigzag pixel array.

Figure 19:
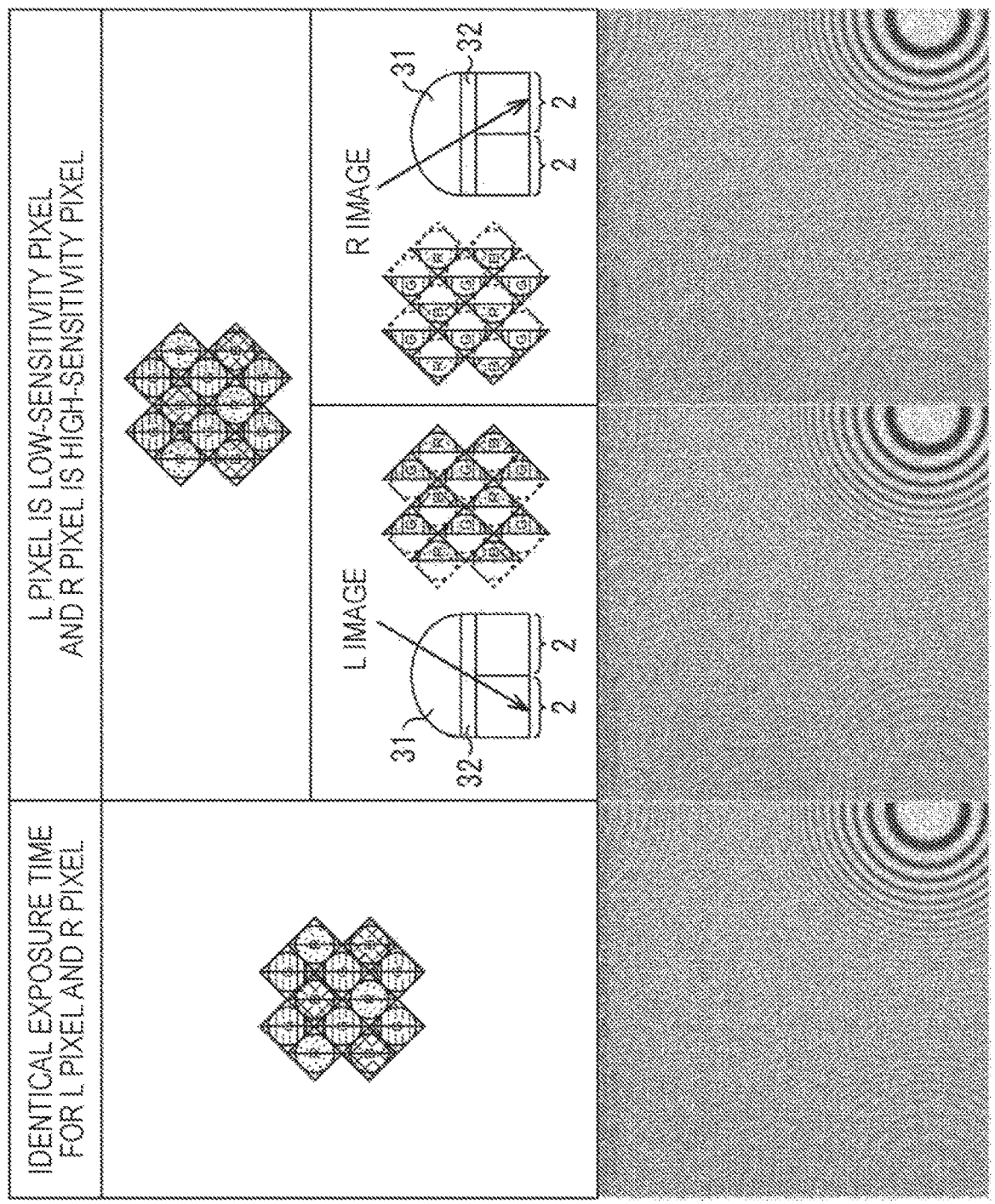
FIG. 19 is a diagram illustrating a CZP image captured by the solid state imaging device having a zigzag pixel array.

FIG. 19 is a diagram illustrating (a part of) a circular zone plate (CZP) image obtained by capturing a CZP by means of the solid state imaging device 1 having the zigzag pixel array illustrated in FIG. 18. Three CZP images are represented in FIG. 19.

Among the three CZP images in FIG. 19, the left CZP image is a CZP image captured while the exposure times for the two pixels 2 below the single microlens are controlled identically.

On the other hand, the middle and right CZP images in FIG. 19 are CZP images captured while the exposure times for the two pixels 2 below the single microlens, namely, the L pixel and the R pixel, are varied.

More specifically, among the L pixel and the R pixel below the single microlens, the L pixel is the low-sensitivity pixel set to a short exposure time, and the R pixel is the high-sensitivity pixel set to a longer exposure time than the L pixel. The middle CZP image in FIG. 19 is an L image including only a plurality of L pixels set to the short exposure time, and the right CZP image in FIG. 19 is an R image including only a plurality of R pixels set to the long exposure time.

Note that, in the present specification, the designations L pixel and R pixel are based on the position of the photodiode that generates a charge that depends on incident light. Specifically, the L pixel is such a pixel 2 that incident light passes through the right side of the microlens 31 and the color filter 32 and enters the left photodiode in a plan view. The R pixel is such a pixel 2 that incident light passes through the left side of the microlens 31 and the color filter 32 and enters the right photodiode in a plan view.

Comparing the left CZP image in FIG. 19 with the identical exposure time for all the pixels with the middle CZP image of the L pixels in FIG. 19, positions where moire appears are found not to vary. This indicates that spatial frequencies do not vary between the image captured with the identical exposure time for all the pixels and the L image including only the plurality of L pixels set to the short exposure time, and a deterioration in resolution does not occur.

Similarly, comparing the left CZP image in FIG. 19 with the identical exposure time for all the pixels with the right CZP image of the R pixels in FIG. 19, positions where moire appears do not vary. Therefore, spatial frequencies do not vary between the image captured with the identical exposure time for all the pixels and the R image including only the plurality of R pixels set to the long exposure time, and a deterioration in resolution does not occur.

As described with reference to FIG. 10 or the like, when the HDR image is generated, for the pixel with the low-level incident light amount (equal to or less than a predetermined level), the pixel signal of the HDR image is generated using only the high-sensitivity pixel. For the pixel with the high-level incident light amount (equal to or more than a predetermined level), to the contrary, the pixel signal of the HDR image is generated using only the low-sensitivity pixel.

As mentioned above, however, even when the HDR image is generated using only the pixel signal of either the low-sensitivity pixel or the high-sensitivity pixel, resolution of the generated HDR image is not deteriorated by the solid state imaging device 1 having the pixel structure in which the plurality of pixels is arranged below the single microlens.

This is because a state where only one of either the L pixel or the R pixel below the single microlens receives light corresponds to, in a sense, a state where a diaphragm is stopped down in front of or behind the microlens, and resolution does not change although lightness is changed.

Figure 20:
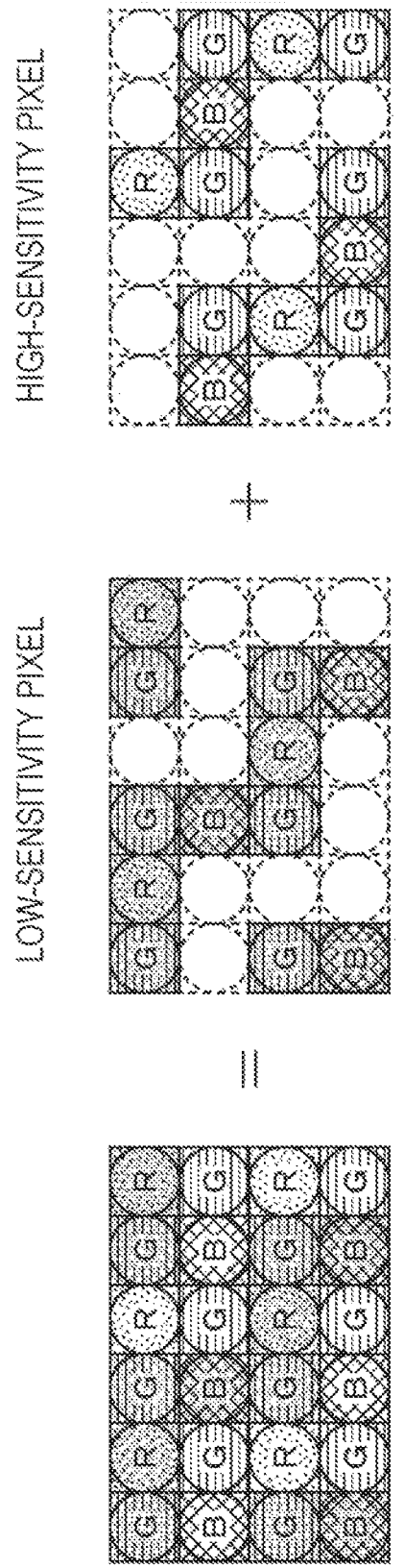
FIG. 20 is a diagram illustrating an example of a single lens single pixel array.

Meanwhile, FIG. 20 is a diagram illustrating an example of the single lens single pixel array.

The single lens single pixel array of FIG. 20 is a Bayer array. When the HDR image is generated, for example, as illustrated in FIG. 20, the exposure time is controlled so that among the pixels having the color filters of the same color, the high-sensitivity pixels and the low-sensitivity pixels are alternately arranged within a predetermined neighboring region.

Assume that the solid state imaging device having the single lens single pixel array of FIG. 20 controls the exposure time to generate the HDR image, and a state where the pixel signal of only the high-sensitivity pixel or only the low-sensitivity pixel is available in accordance with the magnitude of the incident light amount has occurred. In this case, since the pixel with unavailable sensitivity becomes a total lost pixel, the HDR image becomes a spatially decimated image, whereby a deterioration in resolution occurs.

Figure 21:
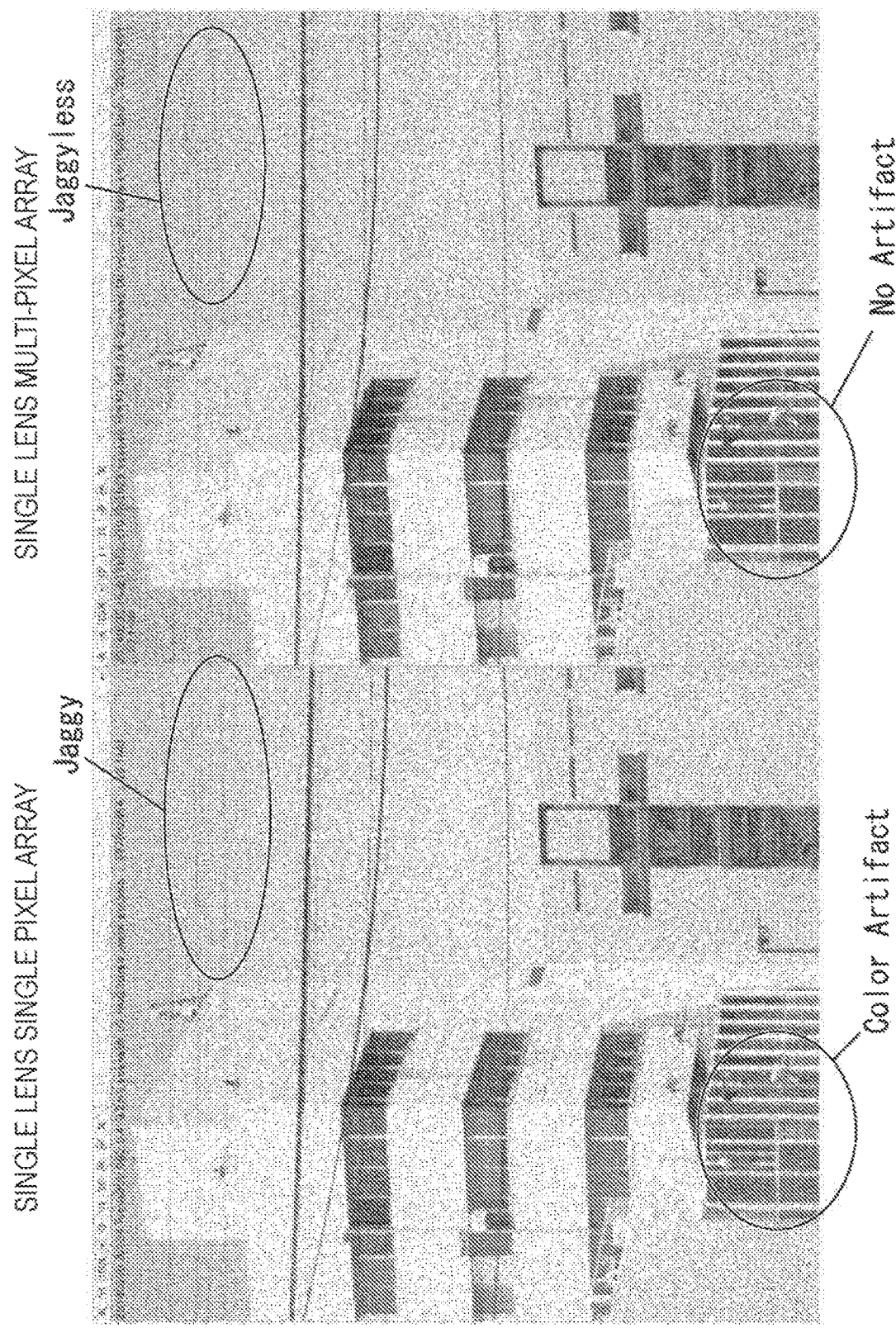
FIG. 21 is a diagram comparing an HDR image captured by the single lens multi-pixel array and an HDR image captured by the single lens single pixel array.

FIG. 21 is a diagram illustrating HDR images obtained by capturing the same scene by means of the single lens multi-pixel array of FIG. 18 and the single lens single pixel array of FIG. 20.

The right HDR image in FIG. 21 is the image captured by the single lens multi-pixel array of FIG. 18, and the left HDR image in FIG. 21 is the image captured by the single lens single pixel array of FIG. 20.

In the left HDR image in FIG. 21, a color artifact (false color) and a jaggy caused by a deterioration in resolution are observed. In the right HDR image in FIG. 21, on the other hand, a color artifact (false color) and a jaggy are not observed. Note that it is difficult to tell the color artifact and the jaggy in FIG. 21 due to a limitation on the representation of the drawing.

As described above, the HDR image generated when the dynamic range expansion process is performed by the solid state imaging device 1 with the pixel structure of the single lens multi-pixel array can be a high-definition HDR image that is free from a deterioration in resolution.

<Application to Phase Difference Detection>

Meanwhile, if the pixel signal of each of the two pixels 2 that receive incident light that has passed through the single microlens 31 can be obtained, phase difference information can be detected using these pixel signals, and autofocus control can be performed using the detected phase difference information.

As described in FIG. 19, however, in a case where the exposure times for the L pixel and the R pixel below the single microlens are varied and the exposure is controlled, a state where the pixel signal of only the low-sensitivity pixel or only the high-sensitivity pixel is available in accordance with the incident light amount might occur. In this case, since a pairing of the L pixel and the R pixel with a symmetric light receiving range cannot be obtained, a phase difference cannot be detected. This state is likely to occur particularly when an exposure ratio (exposure time ratio) between the low-sensitivity pixel and the high-sensitivity pixel is large.

In this context, the single lens multi-pixel array that also enables the detection of the phase difference will be described below.

<Exemplary First Exposure Control for Phase Difference Detection>

Figure 22:
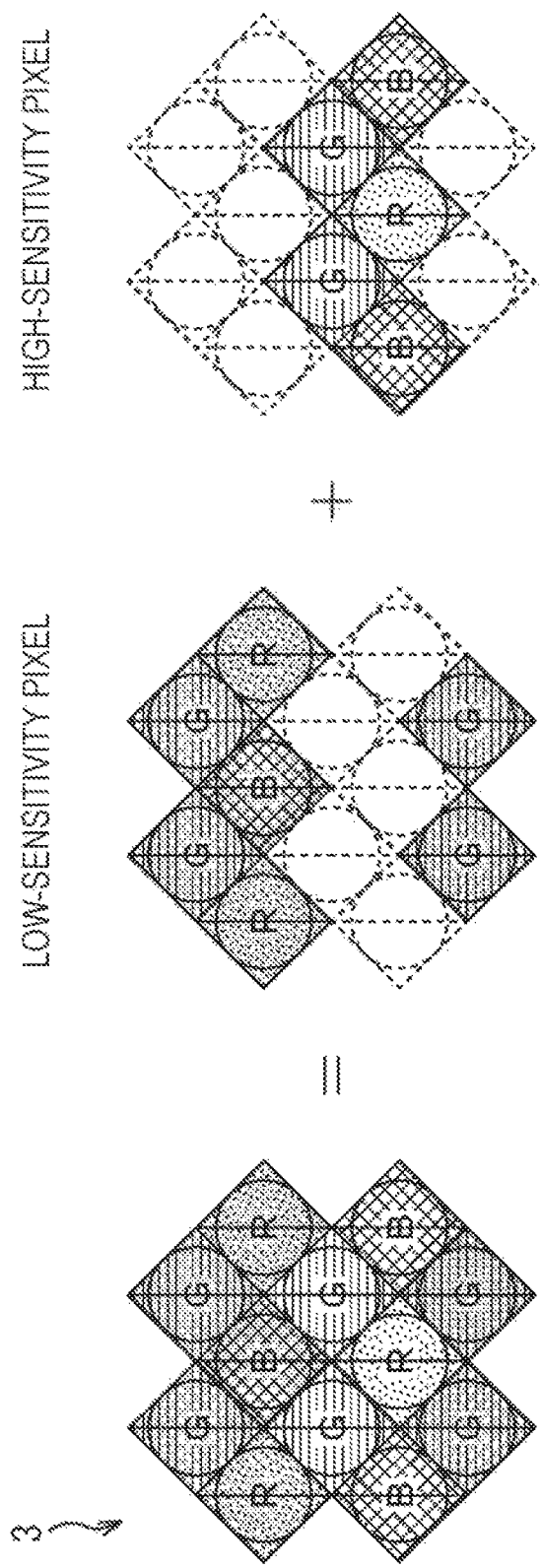
FIG. 22 is a diagram explaining exemplary first exposure control for phase difference detection.

FIG. 22 is a diagram explaining first exposure control that enables the phase difference detection in the solid state imaging device 1 having the zigzag pixel array of FIG. 18.

In the first exposure control, the low-sensitivity pixel and the high-sensitivity pixel are not separated into the L pixel and the R pixel as illustrated in FIG. 19, but separated in units of rows and then controlled. In the example of FIG. 22, the low-sensitivity pixel is represented by the gray color and the high-sensitivity pixel is represented without the gray color (i.e., by the white color). Pixel rows of the low-sensitivity pixels and pixel rows of the high-sensitivity pixels are alternately arranged in units of two rows.

In the first exposure control, even when a state where the pixel signal of only the high-sensitivity pixel or only the low-sensitivity pixel is available occurs, the pairing of the L pixel and the R pixel with the same sensitivity remains, whereby the phase difference can be detected. Note that, in the first exposure control, however, when a state where the pixel signal of only the high-sensitivity pixel or only the low-sensitivity pixel is available occurs, the pixels are lost in units of two pixel rows.

<Exemplary Second Exposure Control for Phase Difference Detection>

Figure 23:
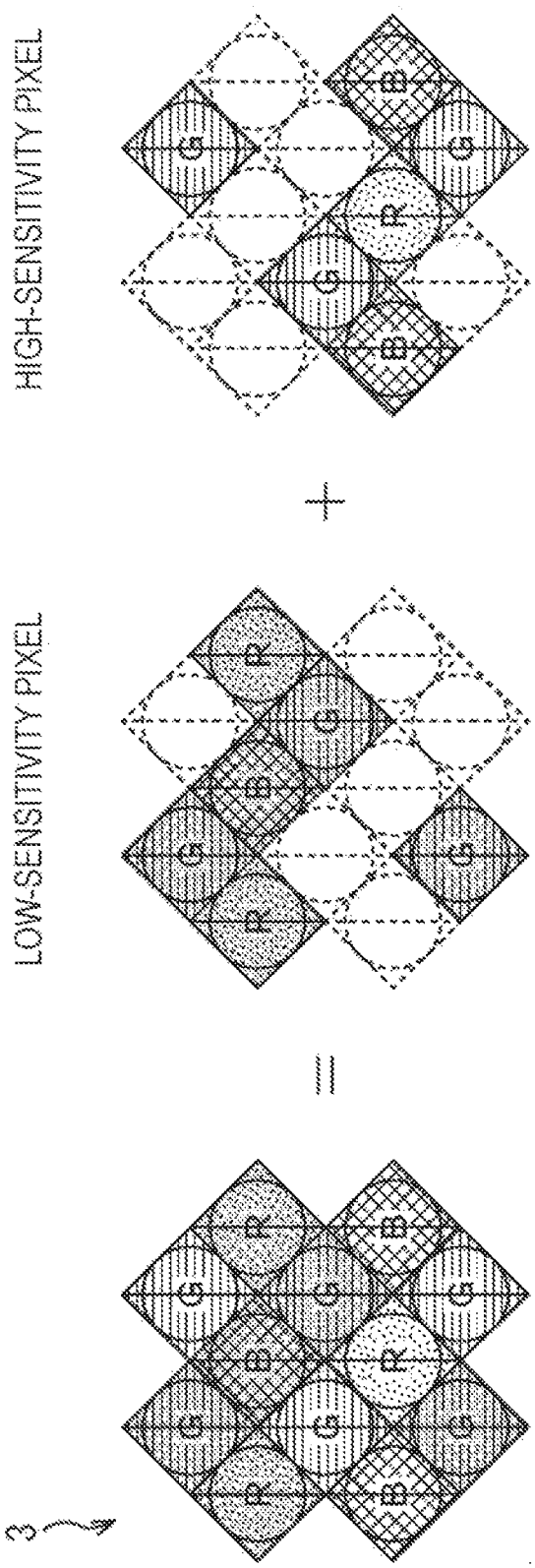
FIG. 23 is a diagram explaining exemplary second exposure control for phase difference detection.

FIG. 23 is a diagram explaining second exposure control that enables the phase difference detection in the solid state imaging device 1 having the zigzag pixel array of FIG. 18.

In the second exposure control, in a similar way to the single lens single pixel array of FIG. 20, the low-sensitivity pixels and the high-sensitivity pixels are set so that the high-sensitivity pixels and the low-sensitivity pixels are alternately arranged within a predetermined neighboring region in units of two pixels that share the color filter 32 of the same color.

In the second exposure control, even when a state where the pixel signal of only the high-sensitivity pixel or only the low-sensitivity pixel is available occurs, the pairing of the L pixel and the R pixel with the same sensitivity remains, whereby the phase difference can be detected. In addition, since the low-sensitivity pixel and the high-sensitivity pixel coexist in a single pixel row, the entire pixel row is not lost even when a state where the pixel signal of only the high-sensitivity pixel or only the low-sensitivity pixel is available occurs.

In the second exposure control, however, spatial decimation is caused when a state where the pixel signal of only the high-sensitivity pixel or only the low-sensitivity pixel is available occurs, whereby a color artifact (false color) and a jaggy occur.

As described above, according to the above-mentioned first exposure control and second exposure control, the HDR image can be generated when the dynamic range expansion process is performed, and the phase difference can also be detected.

However, when a state where the pixel signal of only the low-sensitivity pixel or only the high-sensitivity pixel is available occurs, both the L pixel and the R pixel below the single microlens are not available, whereby the spatial decimation is caused and a deterioration in resolution occurs.

<Exemplary Third Exposure Control and Fourth Exposure Control for Phase Difference Detection>

Figure 24:
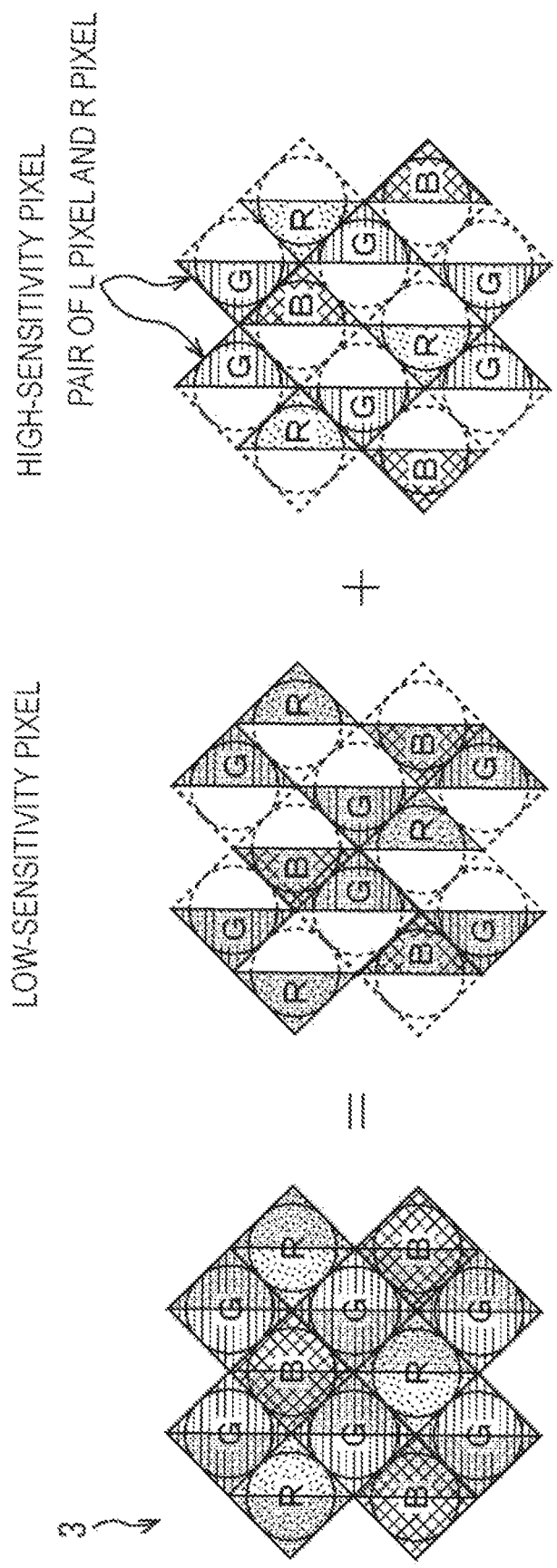
FIG. 24 is a diagram explaining exemplary third exposure control for phase difference detection.

FIG. 24 is a diagram explaining third exposure control that enables the phase difference detection in the solid state imaging device 1 having the zigzag pixel array of FIG. 18.

Figure 25:
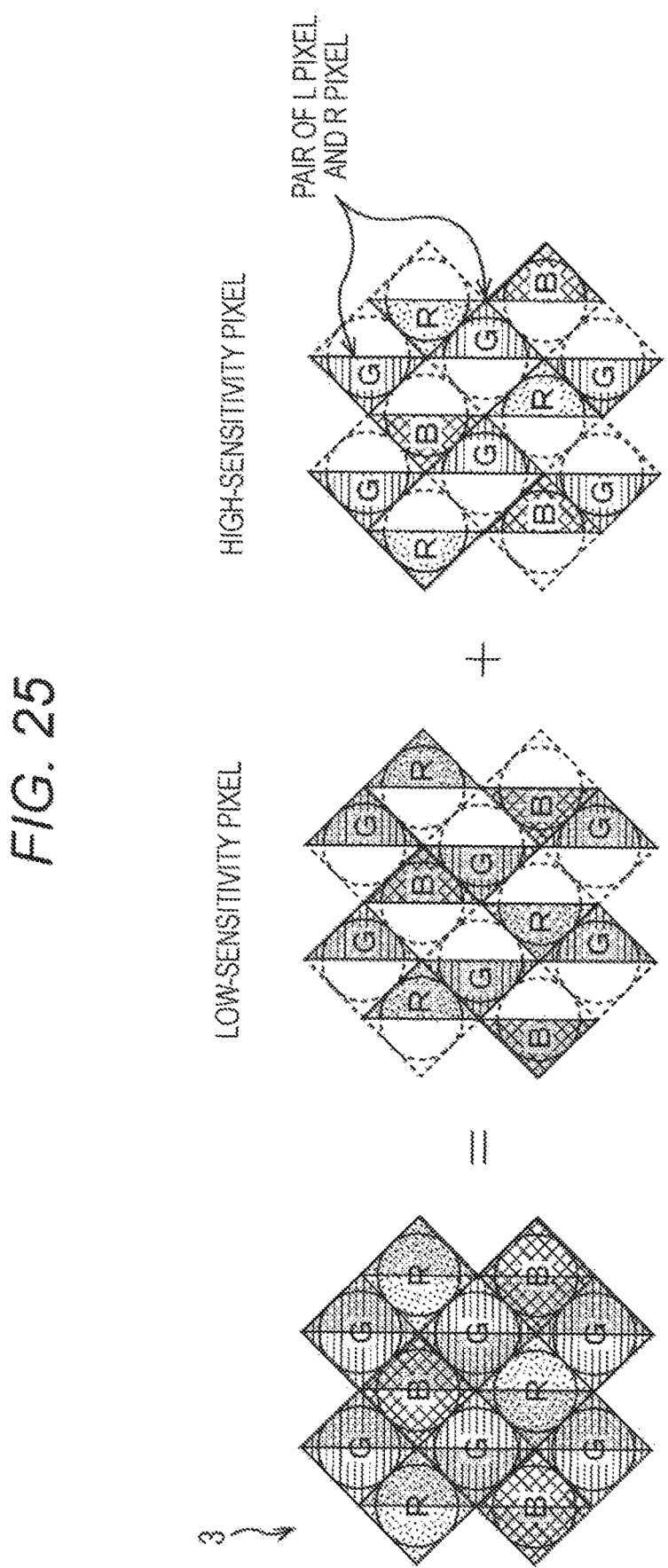
FIG. 25 is a diagram explaining exemplary fourth exposure control for phase difference detection.

FIG. 25 is a diagram explaining fourth exposure control that enables the phase difference detection in the solid state imaging device 1 having the zigzag pixel array of FIG. 18.

FIGS. 24 and 25 are similar to FIGS. 22 and 23 in that the low-sensitivity pixel is represented by the gray color and the high-sensitivity pixel is represented without the gray color (i.e., by the white color).

The third exposure control and the fourth exposure control illustrated in FIGS. 24 and 25 have a common feature in that the L pixel and the R pixel below the single microlens are separated and controlled so that one of the L pixel and the R pixel becomes the low-sensitivity pixel and the other becomes the high-sensitivity pixel.

A difference between the third exposure control and the fourth exposure control is that arrangement of the low-sensitivity pixels and the high-sensitivity pixels in the same pixel row is alternated in units of adjacent color filters 32 of the same color in FIG. 24, while arrangement of the low-sensitivity pixels and the high-sensitivity pixels is common to each pixel row in FIG. 25.

Specifically, in FIG. 24, for example, assuming that predetermined two pixels that share the color filter 32 of G are configured such that the L pixel is set to the high-sensitivity pixel and the R pixel is set to the low-sensitivity pixel, two pixels that share the color filter 32 of G adjacent to the predetermined two pixels are configured, to the contrary, such that the L pixel is the low-sensitivity pixel and the R pixel is the high-sensitivity pixel. The same applies to units of two pixels that share the color filter 32 of R or B.

On the other hand, in FIG. 25, a predetermined pixel row having the color filter 32 of G is configured such that the L pixel is set to the high-sensitivity pixel and R pixel is set to the low-sensitivity pixel, and a pixel row having the color filter 32 of G above or below the predetermined pixel row is configured, to the contrary, such that the L pixel is set to the low-sensitivity pixel and the R pixel is set to the high-sensitivity pixel.

When the exposure is controlled as described in FIG. 24, therefore, the pairing of the L pixel and the R pixel with the symmetric light receiving range can be obtained in the adjacent four pixels that share the color filters 32 of the same color within the same pixel row.

On the other hand, when the exposure is controlled as described in FIG. 25, the pairing of the L pixel and the R pixel with the symmetric light receiving range can be obtained in such a manner that the adjacent pixel rows having the color filters 32 of the same color are paired.

As described above, in the third exposure control and the fourth exposure control, the HDR image can be generated when the dynamic range expansion process is performed, and the phase difference can also be detected.

In the third exposure control and the fourth exposure control, however, since the pairing of the L pixel and the R pixel causes such a pair of pixels that light receiving positions are displaced by a half pitch, parallax might be mixed and cause a color deviation.

<Problem of Phase Difference Pixel Using Light Shielding Film>

Figure 26A:
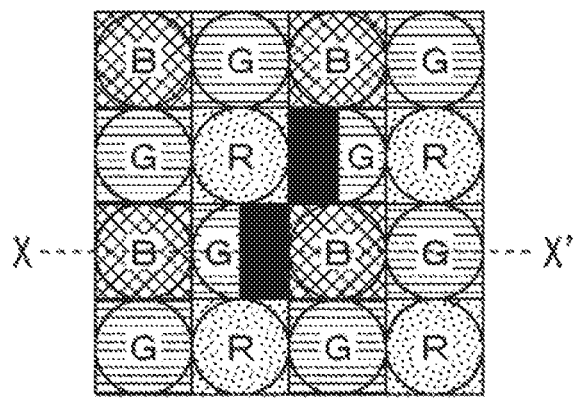
FIG. 26A and FIG. 26B are diagrams explaining a problem of a phase difference pixel using a light shielding film.
Figure 26B:
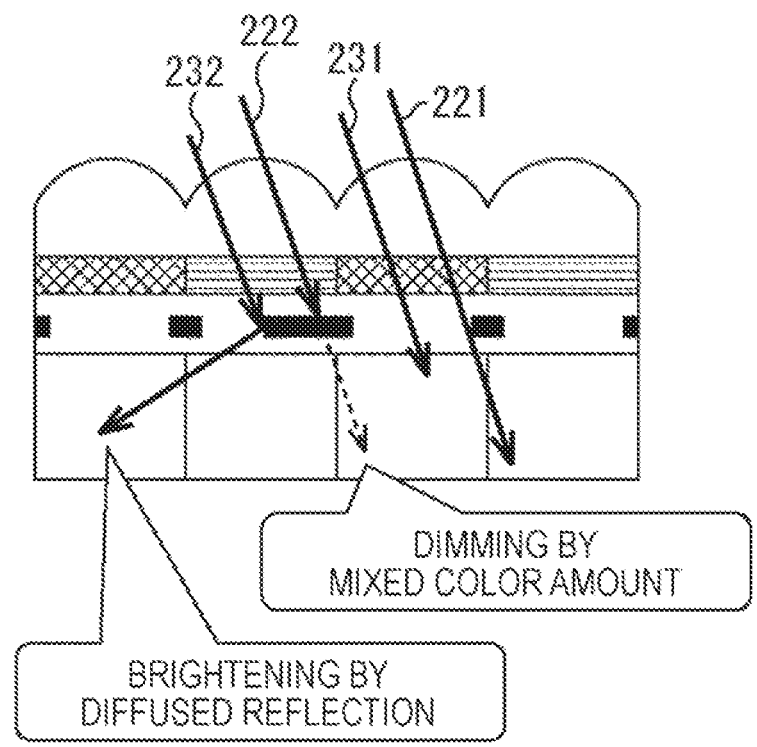

As a method for detecting the phase difference, as illustrated in FIGS. 26A-26B, a method to form, by means of a light shielding film, asymmetry of incident light on a part of a plurality of pixels two-dimensionally arrayed is known.

FIG. 26A is a plan diagram of a pixel array unit including a phase difference pixel using a light shielding film, and FIG. 26B is a cross-sectional diagram taken along line X-X' of FIG. 26A.

The phase difference pixel using such a light shielding film contains the following two problems.

One is such a problem that incident light is shielded by the light shielding film by a mixed color amount and a peripheral pixel of the phase difference pixel is dimmed.

To be more specific, intrinsically, in the absence of the light shielding film, in accordance with an angle of incident light, there is light that enters a photodiode of a pixel adjacent to a pixel for a microlens through which the light has passed, as represented by incident light 221 of FIG. 26B. In the presence of the light shielding film, however, light that should intrinsically enter the photodiode of the adjacent pixel is shielded by the light shielding film, as represented by incident light 222. Therefore, light is reduced by the mixed color amount in the pixel adjacent to the phase difference pixel.

The other is such a problem that the peripheral pixel of the phase difference pixel is brightened due to reflection at the light shielding film.

To be more specific, intrinsically, in the absence of the light shielding film, entering light enters the photodiode straight, as represented by incident light 231 of FIG. 26B. In the presence of the light shielding film, however, light that should enter the photodiode straight is reflected by the light shielding film, as represented by incident light 232. Therefore, light is increased by the reflected amount in the pixel adjacent to the phase difference pixel.

In this manner, the phase difference pixel using the light shielding film has an influence on incident light in the peripheral pixel of the phase difference pixel. Therefore, in addition to a pixel interpolation process for interpolating (correcting) the phase difference pixel as a defective pixel that cannot generate a pixel signal for image generation, a correction process for correcting the light amount change caused by the above-mentioned reason needs to be performed on the peripheral pixel of the phase difference pixel. However, such a correction process is difficult.

<Exemplary Fifth Exposure Control for Phase Difference Detection>

FIG. 27 is a diagram explaining fifth exposure control that enables the phase difference detection in the solid state imaging device 1 having the zigzag pixel array of FIG. 18. FIG. 27 is also similar to FIGS. 22 to 25 mentioned above in that the low-sensitivity pixel is represented by the gray color and the high-sensitivity pixel is represented without the gray color (i.e., by the white color).

In FIG. 27, the L pixels are the low-sensitivity pixels and the R pixels are the high-sensitivity pixels below most of the microlenses within the pixel array unit 3. Hereinafter, such a pair of pixels that the two pixels 2 below the single microlens form a pair of the low-sensitivity pixel and the high-sensitivity pixel is referred to as a pair of sensitivity difference pixels 250.

In FIG. 27, however, in a part of the pixel array unit 3, there are a place where both the L pixel and the R pixel below the single microlens are the low-sensitivity pixels and a place where both the L pixel and the R pixel below the single microlens are the high-sensitivity pixels. Hereinafter, such a pair of pixels that both the L pixel and the R pixel below the single microlens are the low-sensitivity pixels is referred to as a pair of low-sensitivity phase difference pixels 251, and such a pair of pixels that both the L pixel and the R pixel below the single microlens are the high-sensitivity pixels is referred to as a pair of high-sensitivity phase difference pixels 252.

The R pixel of the pair of low-sensitivity phase difference pixels 251 is a pixel irregularly subjected to low-sensitivity exposure control, whereas most of the R pixels within the pixel array unit 3 (R pixel of the pair of sensitivity difference pixels 250) are regularly subjected to high-sensitivity exposure control. In addition, the L pixel of the pair of high-sensitivity phase difference pixels 252 is a pixel irregularly subjected to high-sensitivity exposure control, whereas most of the L pixels within the pixel array unit 3 (L pixel of the pair of sensitivity difference pixels 250) are regularly subjected to low-sensitivity exposure control. As described above, among the pair of low-sensitivity phase difference pixels 251 and the pair of high-sensitivity phase difference pixels 252, one of the pixels irregularly subjected to the exposure control is hereinafter referred to as an irregular exposure control pixel.

The vertical drive circuit 4 of the solid state imaging device 1 controls the exposure time for each pixel 2 as described with reference to FIG. 27. Consequently, the signal processing circuit 12 performs the dynamic range expansion process using the pixel signal of the pair of sensitivity difference pixels 250 configured such that the L pixel and the R pixel below the single microlens form the pair of the low-sensitivity pixel and the high-sensitivity pixel, whereby the HDR image can be generated.

In addition, the signal processing circuit 12 can also output a phase difference signal using at least one of the pair of low-sensitivity phase difference pixels 251 and the pair of high-sensitivity phase difference pixels 252.

According to the solid state imaging device 1, therefore, it is possible to achieve both the generation of the HDR image and the generation of the phase difference information.

The pair of low-sensitivity phase difference pixels 251 and the pair of high-sensitivity phase difference pixels 252 each include the two pixels 2 located below the single microlens 31. Therefore, since its phase difference signal is not a phase difference signal of a pair of spatially displaced pixels such as a phase difference signal obtained by the exposure control in FIGS. 24 and 25, parallax is not mixed in the phase difference signal.

In addition, since the pair of low-sensitivity phase difference pixels 251 and the pair of high-sensitivity phase difference pixels 252 are not configured to form asymmetry of incident light by shielding incident light using the light shielding film as described with reference to FIGS. 26A-26B, incident light is not dimmed and sensitivity is not reduced.

Therefore, according to the detection of the phase difference by means of the pair of low-sensitivity phase difference pixels 251 and the pair of high-sensitivity phase difference pixels 252, phase difference accuracy can be improved.

In addition, a pixel structure of each of the pair of low-sensitivity phase difference pixels 251 and the pair of high-sensitivity phase difference pixels 252 is not such a structure as to shield incident light using the light shielding film, but the same structure as those of the other pixels 2. Therefore, the problem associated with the phase difference pixel having the light shielding film illustrated in FIGS. 26A-26B does not occur. Specifically, the phase difference pixel does not affect the peripheral pixel thereof in terms of the sensitivity.

Thus, only the pixel interpolation process for interpolating the phase difference pixel as a defective pixel that cannot generate a pixel signal for image generation needs to be performed, and the correction process for correcting the light amount change does not need to be performed on the peripheral pixel of the phase difference pixel. As a result, a processing amount of the correction process can be reduced.

Note that, in the above-mentioned pair of low-sensitivity phase difference pixels 251 and pair of high-sensitivity phase difference pixels 252, the sensitivity difference between the two pixels 2 serving as a pair of pixels is identically set. However, a slight exposure time difference may be produced in such a range that no problem occurs with the generation of the phase difference information.

<Operation Mode for Improving Phase Difference Detection Accuracy>

It is possible to achieve both the generation of the HDR image and the phase difference detection by controlling the exposure time for each pixel as described in the above-mentioned fifth exposure control. In a case where the number of pairs of low-sensitivity phase difference pixels 251 and the number of pairs of high-sensitivity phase difference pixels 252 within the pixel array unit 3 are small, and there is little phase difference information, it is possible to improve the phase difference detection accuracy by executing the following operation mode.

Figure 28:
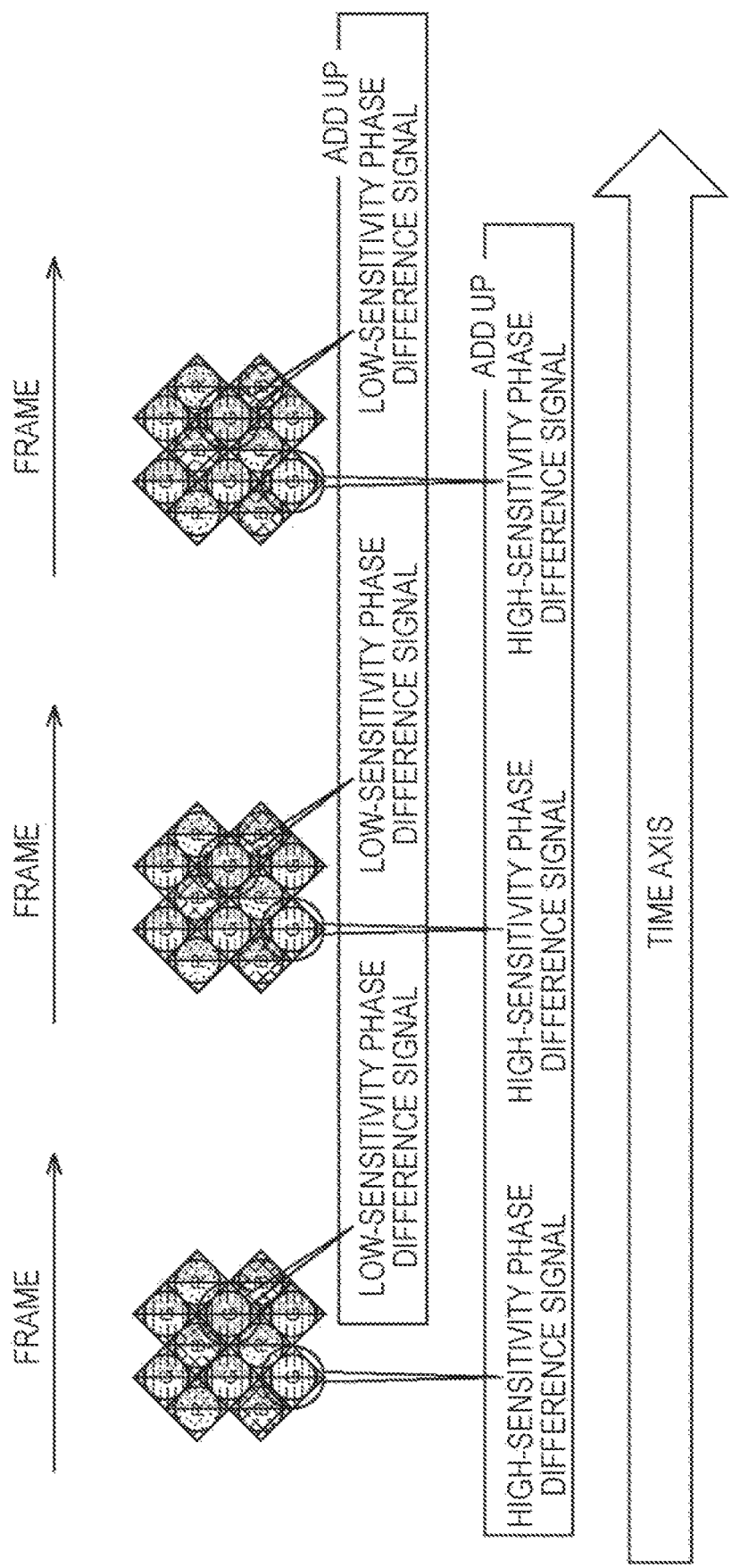
FIG. 28 is a diagram explaining an operation mode for photographing a motion picture.

FIG. 28 is a diagram explaining an operation mode for photographing a motion picture.

When a motion picture is photographed, a signal obtained by adding up phase difference signals of a plurality of frames is used as a signal for the phase difference detection, whereby performance of phase difference autofocus can be improved almost to that of phase difference autofocus for performing the phase difference detection in all the pixels.

Note that, as for the pair of sensitivity difference pixels 250 with the middle-level signal amount described with reference to FIG. 10, namely, the pair of sensitivity difference pixels 250 with such a signal amount that the incident light amount is in a range where the dynamic range of the low-sensitivity pixel and the dynamic range of the high-sensitivity pixel overlap each other, then two pixel signals of the low-sensitivity pixel and the high-sensitivity pixel may also be used for the phase difference detection.

FIG. 29 is a diagram explaining an operation mode for photographing a still picture.

The operation for photographing a still picture is separated into preview photographing operation and record photographing operation. In the preview photographing operation, an image to be photographed is displayed on a finder or a display and checked. In the record photographing operation, an image is recorded in a predetermined recording medium in response to a depression of a shutter button.

In the preview photographing operation, the vertical drive circuit 4 sets the exposure time for each pixel 2 within the pixel array unit 3 to such an exposure time that the phase detection is enabled in all the pixels. For example, the vertical drive circuit 4 identically controls the exposure times for the L pixel and the R pixel below the single microlens. Alternatively, the vertical drive circuit 4 sets the exposure ratio between the L pixel and the R pixel below the single microlens to an exposure ratio (for example, 2 to 4 times) lower than an exposure ratio (for example, 10 to 12 times) at the time of the original HDR photographing.

As a result, in the preview photographing operation, the phase difference can also be detected in the pair of sensitivity difference pixels 250 other than the pair of low-sensitivity phase difference pixels 251 and the pair of high-sensitivity phase difference pixels 252 within the pixel array unit 3, and a photographed image can be displayed on a finder or a display.

In addition, in the record photographing operation, the vertical drive circuit 4 changes the exposure time for each pixel 2 within the pixel array unit 3 to the exposure ratio (for example, 10 to 12 times) at the time of the original HDR photographing. The vertical drive circuit 4 then performs capturing and recording by means of the exposure control described in FIG. 27. The focus is controlled on the basis of the phase difference detected at the time of the preview photographing operation.

On the irregular exposure control pixel of the pair of low-sensitivity phase difference pixels 251 and the pair of high-sensitivity phase difference pixels 252 within the pixel array unit 3, the signal processing circuit 12 performs the pixel interpolation process, in which the pixel is interpolated as a defective pixel.

Note that the irregular exposure control pixel of the pair of low-sensitivity phase difference pixels 251 and the pair of high-sensitivity phase difference pixels 252 may be subjected to exposure control in the same way as the pair of sensitivity difference pixels 250, if possible.

<Drive Control Wiring Diagram>

Next, with reference to FIGS. 30 and 31, drive control wiring for arranging the pair of low-sensitivity phase difference pixels 251 and the pair of high-sensitivity phase difference pixels 252 within the pixel array unit 3 will be described.

Figure 30:
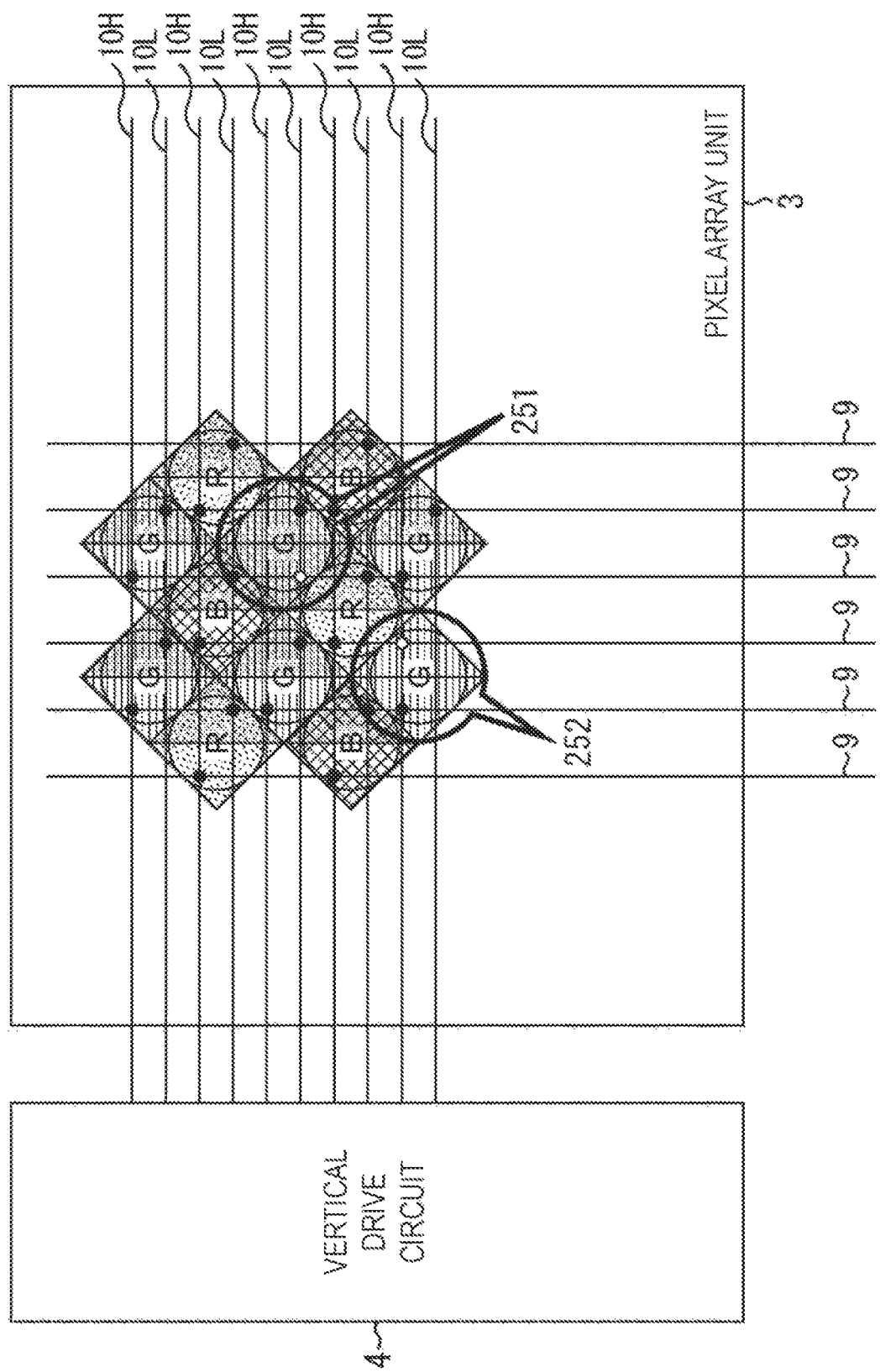
FIG. 30 is a diagram explaining drive control wiring within the pixel array unit.

In a case where the column signal processing circuit 5 is arranged for each pixel column of the plurality of pixels 2 two-dimensionally arrayed in the zigzag pixel array, and each pixel 2 and the column signal processing circuit 5 are coupled via the vertical signal line 9, then the pixel drive wiring 10 needs to be separated for the low-sensitivity pixel and the high-sensitivity pixel as illustrated in FIG. 30.

In FIG. 30, as the pixel drive wiring 10, two lines including pixel drive wiring 10H for the high-sensitivity pixel and pixel drive wiring 10L for the low-sensitivity pixel are provided for a single pixel row.

In addition, the irregular exposure control pixel of the pair of low-sensitivity phase difference pixels 251 is connected to the pixel drive wiring 10L for the low-sensitivity pixel in the same way as the other low-sensitivity pixel of that pair of pixels. In addition, the irregular exposure control pixel of the pair of high-sensitivity phase difference pixels 252 is connected to the pixel drive wiring 10H for the high-sensitivity pixel in the same way as the other low-sensitivity pixel of that pair of pixels. In FIG. 30, connection points of the irregular exposure control pixels are represented by white circles (□), and connection points of the other pixels are represented by black circles (□).

In this manner, when the column signal processing circuits 5 are provided in units of pixel columns, the irregular exposure control pixel only needs to be connected to the pixel drive wiring 10 for the other one of the pair of pixels, and the exposure control only needs to conform to the pixel drive wiring 10 for the other one.

Figure 31:
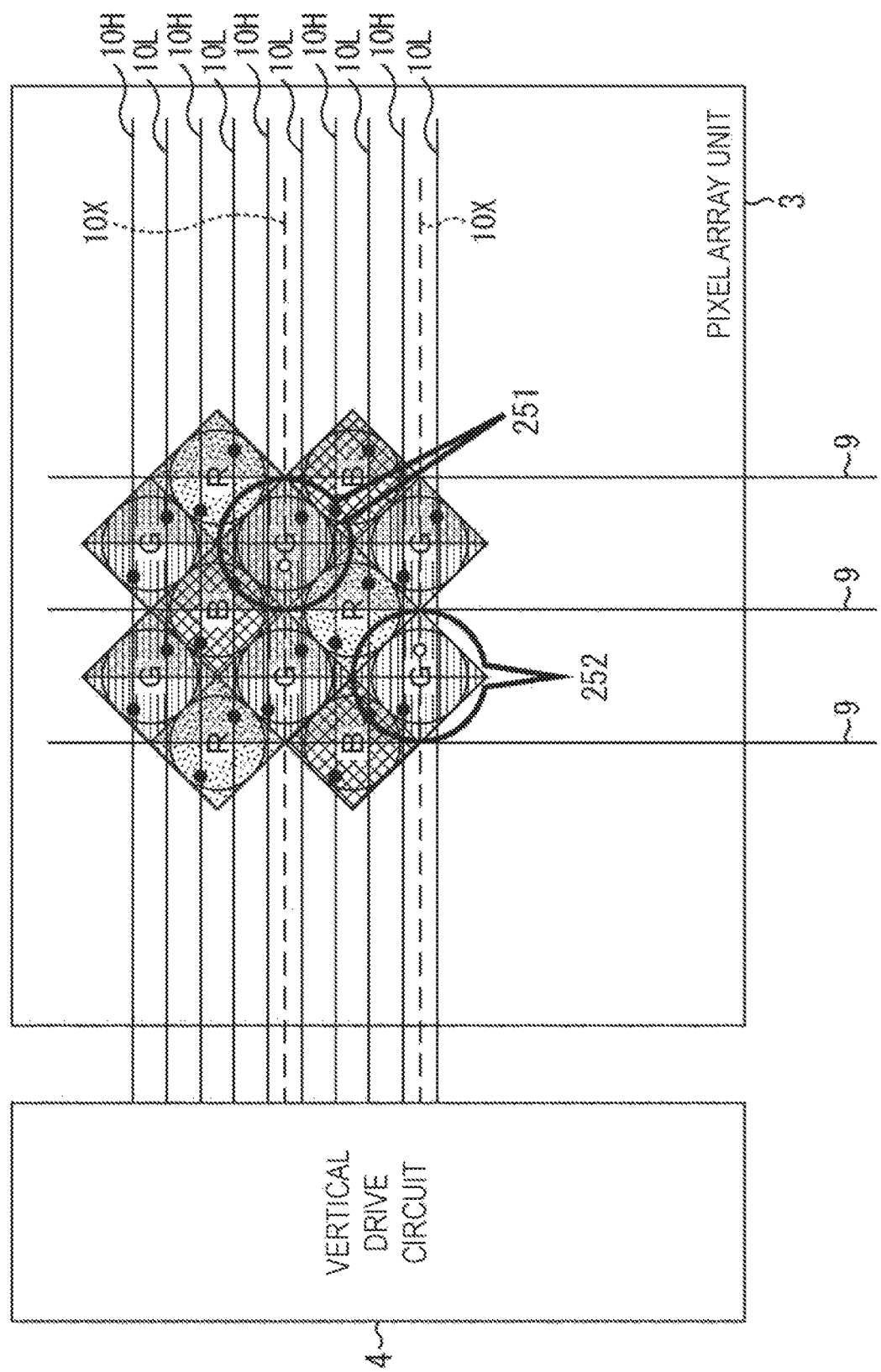
FIG. 31 is a diagram explaining drive control wiring within the pixel array unit.

FIG. 31 is a diagram illustrating drive control wiring for arranging the column signal processing circuit 5 for every two pixel columns.

In this case, the two lines including the pixel drive wiring 10H for the high-sensitivity pixel and the pixel drive wiring 10L for the low-sensitivity pixel are provided in each pixel row. In addition, pixel drive wiring 10X for the irregular exposure control pixel is provided in a pixel row where the irregular exposure control pixel is arranged.

In a case where the column signal processing circuit 5 is arranged for every two pixel columns, and the amplification transistor 27 and the selection transistor 28 described in FIG. 2 are shared by the adjacent two pixels, then the pixel drive wiring 10X dedicated to the irregular exposure control pixel needs to be provided, and the irregular exposure control pixel needs to be independently driven and controlled.

<Another Example of Pixel Array>

Figure 32:
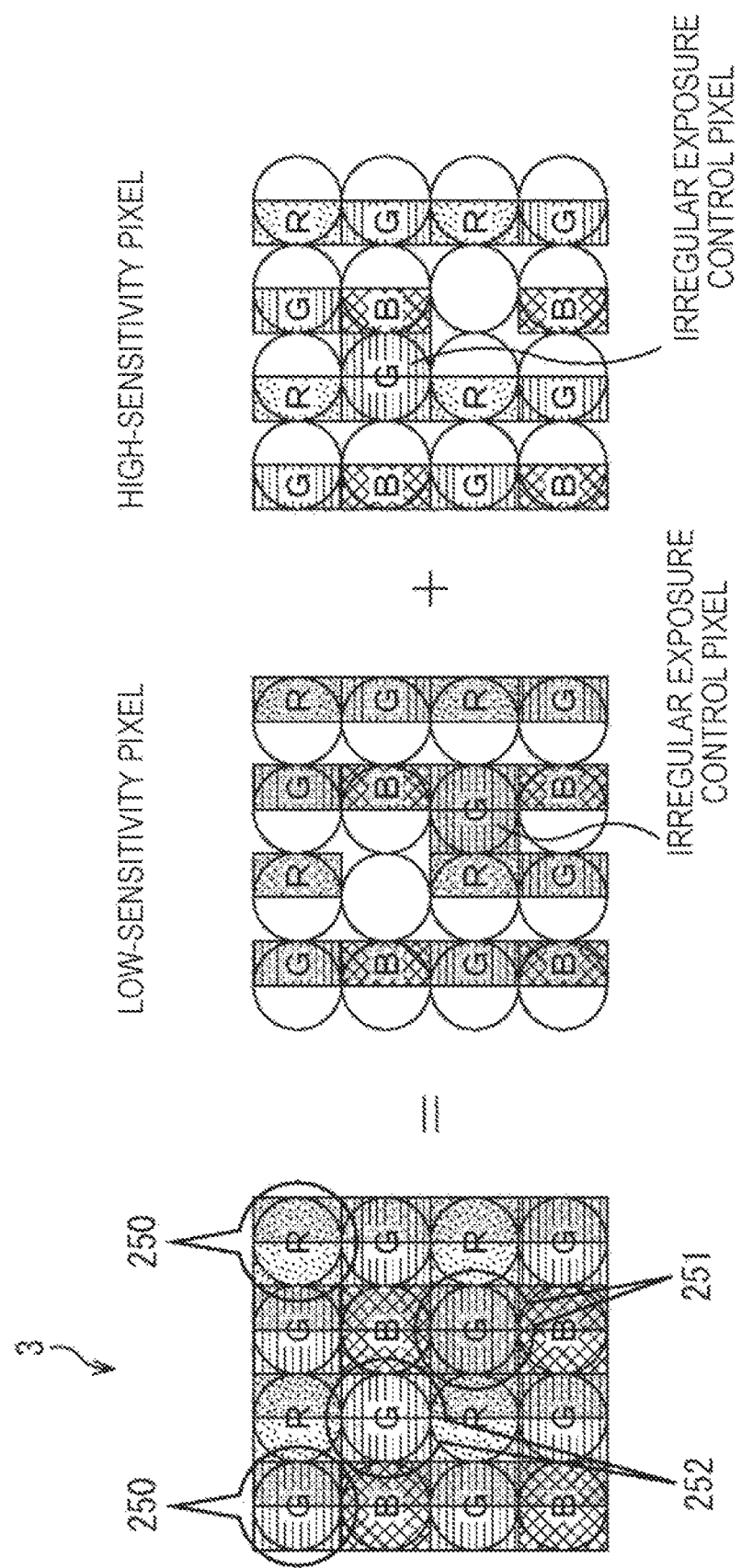
FIG. 32 is a diagram illustrating another example of the single lens multi-pixel array.

FIG. 32 is a diagram illustrating another example of the single lens multi-pixel array of the pixel array unit 3.

The above-mentioned example has described an example in which the pixel array unit 3 includes the zigzag pixel array where the pixels 2 are arrayed in the oblique direction rotated by 45 degrees.

However, the pixel array is not limited to the zigzag pixel array. For example, as illustrated in FIG. 32, the pixel array may be a square array where the pixels 2 are repeatedly arrayed so that pixel boundaries coincide with the horizontal direction or the vertical direction of the pixel array unit 3. In addition, as described with reference to FIG. 17, the single microlens 31 is not necessarily shared by the two pixels 2, and the single microlens 31 only needs to be shared by M×N pixels 2. Furthermore, the present technique can also be applied to a multi-eye camera (stereo camera).

<Imaging Process>

Figure 33:
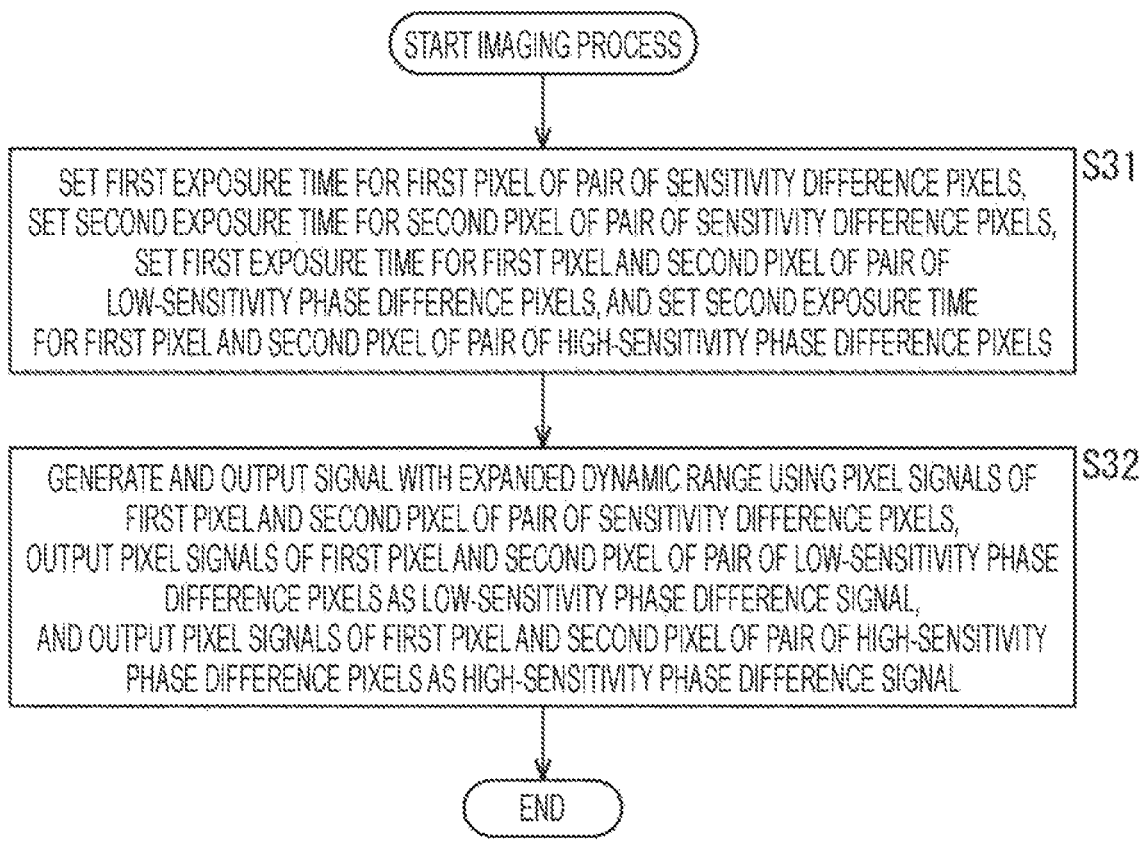
FIG. 33 is a flowchart explaining an imaging process.

With reference to a flowchart in FIG. 33, an imaging process for performing capturing by means of the above-mentioned fifth exposure control will be described.

In step S31, the vertical drive circuit 4 of the solid state imaging device 1 sets a first exposure time for a first pixel of the pair of sensitivity difference pixels 250, sets a second exposure time for a second pixel of the pair of sensitivity difference pixels, sets the first exposure time for a first pixel and a second pixel of the pair of low-sensitivity phase difference pixels 251, and sets the second exposure time for a first pixel and a second pixel of the pair of high-sensitivity phase difference pixels 252. Here, the first pixel corresponds to the L pixel in the above-mentioned description, the second pixel corresponds to the R pixel, the first exposure time corresponds to the exposure time that causes low sensitivity, and the second exposure time corresponds to the exposure time that causes high sensitivity.

In step S32, the signal processing circuit 12 generates and outputs a signal with an expanded dynamic range using pixel signals of the first pixel and the second pixel of the pair of sensitivity difference pixels 250, outputs pixel signals of the first pixel and the second pixel of the pair of low-sensitivity phase difference pixels 251 as a low-sensitivity phase difference signal, and outputs pixel signals of the first pixel and the second pixel of the pair of high-sensitivity phase difference pixels 252 as a high-sensitivity phase difference signal.

The above process is repeated for all the frames in the solid state imaging device 1.

Note that, although the description has been provided on the basis of the premise that the displacement of the formation position of the microlens 31 does not occur, the description can also be applied to a case where the displacement of the formation position of the microlens 31 occurs. In this case, the process only needs to be performed in such a manner that the sensitivity difference caused by the displacement of the formation position of the microlens 31 is first corrected, and the process of steps S31 and S32 described above is performed using the signals after the correction.

<Exemplary Substrate Configuration of Solid State Imaging Device>

Figure 34A:
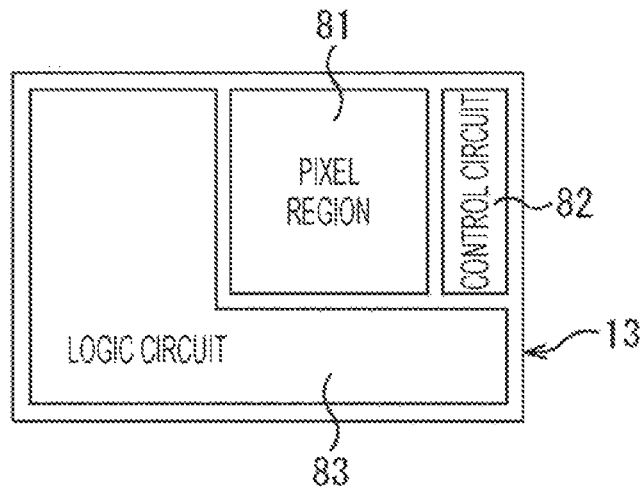
FIG. 34A, FIG. 34B and FIG. 34C are diagrams illustrating an exemplary substrate configuration of the solid state imaging device.

As illustrated in FIG. 34A, the solid state imaging device 1 in FIG. 1 has the single semiconductor substrate 13, on which a pixel region 81, a control circuit 82, and a logic circuit 83 are formed. In the pixel region 81, a plurality of pixels 2 is arrayed in a matrix. The control circuit 82 controls each pixel 2. The logic circuit 83 includes the signal processing circuit 12.

Figure 34B:
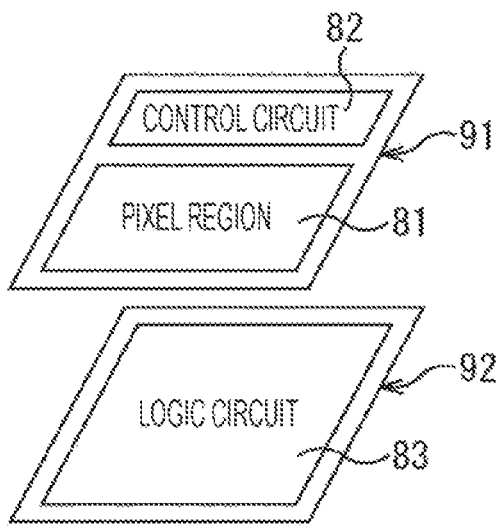

As illustrated in FIG. 34B, however, the solid state imaging device 1 can also be configured such that a first semiconductor substrate 91 on which the pixel region 81 and the control circuit 82 are formed and a second semiconductor substrate 92 on which the logic circuit 83 is formed are laminated together. The first semiconductor substrate 91 and the second semiconductor substrate 92 are electrically coupled, for example, by a through via or Cu—Cu metallic bonding.

Figure 34C:
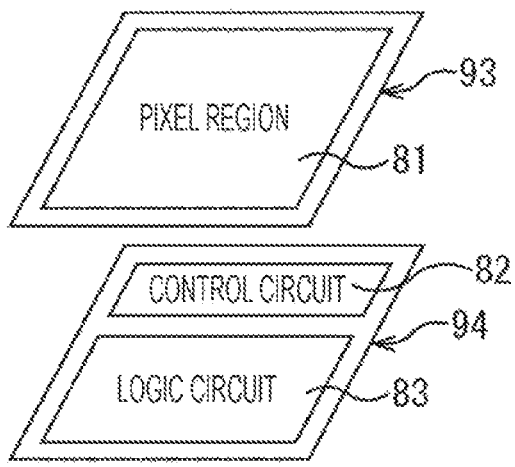

Alternatively, as illustrated in FIG. 34C, the solid state imaging device 1 can also be configured such that a first semiconductor substrate 93 on which only the pixel region 81 is formed and a second semiconductor substrate 94 on which the control circuit 82 and the logic circuit 83 are formed are laminated together. The first semiconductor substrate 93 and the second semiconductor substrate 94 are electrically coupled, for example, by a through via or Cu—Cu metallic bonding.

<Exemplary Application to Electronic Apparatus>

The above-mentioned solid state imaging device 1 can be applied to various electronic apparatuses such as, for example, imaging devices such as a digital still camera and a digital video camera, mobile phones including imaging functions, or audio players including imaging functions.

Figure 35:
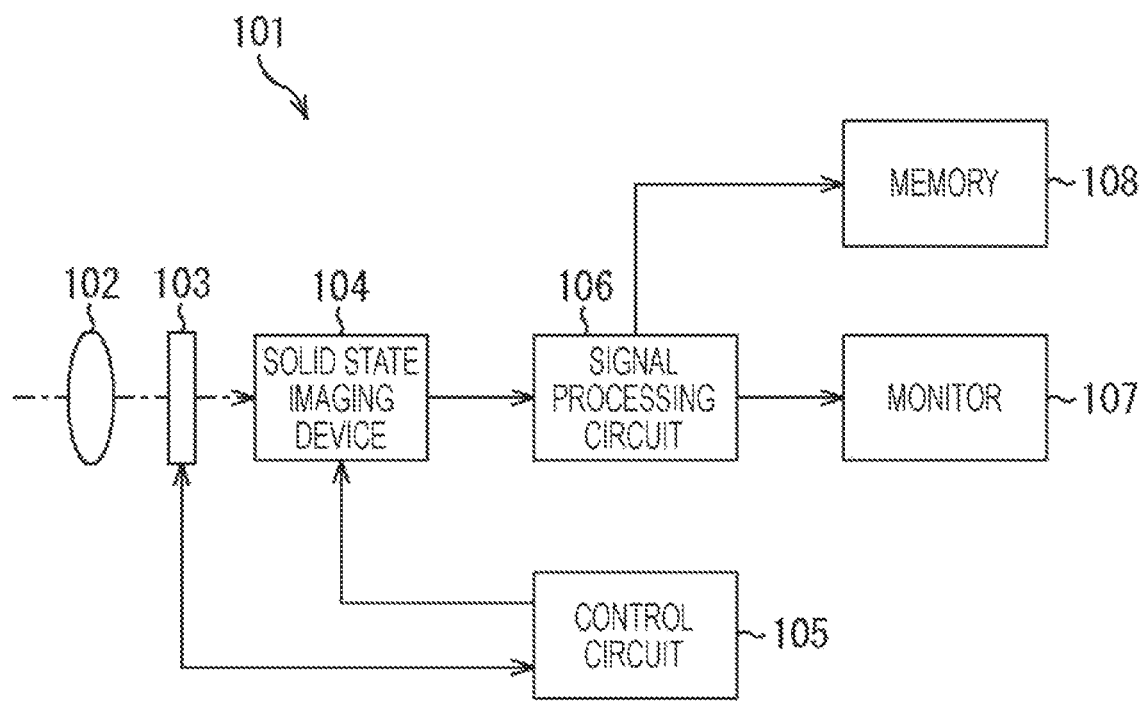
FIG. 35 is a block diagram illustrating an exemplary configuration of an imaging device as an electronic apparatus according to the present disclosure.

FIG. 35 is a block diagram illustrating an exemplary configuration of an imaging device as an electronic apparatus according to the present disclosure.

The imaging device 101 illustrated in FIG. 35 includes an optical system 102, a shutter device 103, a solid state imaging device 104, a control circuit 105, a signal processing circuit 106, a monitor 107, and a memory 108. The imaging device 101 is capable of capturing a still image and a motion image.

The optical system 102 includes one or more lenses and guides light (incident light) from an object to the solid state imaging device 104 to form an image on a light receiving surface of the solid state imaging device 104.

The shutter device 103 is arranged between the optical system 102 and the solid state imaging device 104 and controls a light irradiation period and a light shielding period for the solid state imaging device 104 under the control of the control circuit 105.

The solid state imaging device 104 includes the above-mentioned solid state imaging device 1. The solid state imaging device 104 accumulates a signal charge for a certain period of time in accordance with light from which an image is formed on the light receiving surface through the optical system 102 and the shutter device 103. The signal charge accumulated in the solid state imaging device 104 is transferred in accordance with a drive signal (timing signal)

supplied from the control circuit 105. The solid state imaging device 104 may be configured as one chip by itself, or may be configured as a part of a camera module packaged together with the optical system 102, the signal processing circuit 106 or the like.

The control circuit 105 outputs a drive signal for controlling the transfer operation of the solid state imaging device 104 and the shutter operation of the shutter device 103 to drive the solid state imaging device 104 and the shutter device 103.

The signal processing circuit 106 performs various signal processes on a pixel signal output from the solid state imaging device 104. An image (image data) obtained by the signal processes performed by the signal processing circuit 106 is supplied to and displayed on the monitor 107, or supplied to and stored (recorded) in the memory 108.

Note that the above-mentioned dynamic range expansion process and sensitivity difference correction process may be executed in a signal processing circuit within the solid state imaging device 104, or may be executed by the signal processing circuit 106 that has received a pixel signal from the solid state imaging device 104.

In addition, the signal processing circuit 106 that performs the dynamic range expansion process and the sensitivity difference correction process can also be independently provided as an image processing device that processes an image signal input from the outside by means of a digital signal processor (DSP) or the like.

As mentioned above, the solid state imaging device 1 according to the above-mentioned embodiment is used as the solid state imaging device 104, whereby an image with a high dynamic range and a plurality of images with a corrected sensitivity difference can be generated. Therefore, quality of a captured image can be improved in the imaging device 101 such as a video camera or a digital still camera, and a camera module for a mobile apparatus such as a mobile phone.

The above-mentioned example has described the solid state imaging device configured such that the first conduction type is the p-type, the second conduction type is the n-type, and the photoelectron is the signal charge. However, the technique of the present disclosure can also be applied to such a solid state imaging device that a hole is the signal charge. Specifically, each of the aforementioned semiconductor regions can be configured to be a semiconductor region having an inverse conduction type in such a manner that the first conduction type is the n-type and the second conduction type is the p-type.

In addition, the technique of the present disclosure is not limited to the application to a solid state imaging device that detects a distribution of an incident light amount of visible light and captures it as an image. The technique of the present disclosure can be generally applied to a solid state imaging device that captures, as an image, a distribution of an incident amount of infrared, X-rays, particles or the like, or, in a broad sense, a solid state imaging device (physical quantity detection device) such as a fingerprint detection sensor that detects a distribution of other physical quantities such as pressure and capacitance and captures it as an image.

The embodiment of the present disclosure is not limited to the above-mentioned embodiment, and can be variously changed in a range not departing from the gist of the present disclosure.

For example, an embodiment that combines all or a part of the above-mentioned plurality of embodiments can be employed.

Note that the effects described in the present specification are merely examples and not limited. Effects other than those described in the present specification may also be obtained.

Note that the present disclosure can also be configured as follows.

(1)

A solid state imaging device including a pixel array unit configured such that a plurality of pixels each having the same light receiving region is arranged in a matrix, and light that has entered a single microlens enters the plurality of pixels adjacent to each other, wherein a first pixel and a second pixel included in the plurality of pixels below the microlens of the pixel array unit are set to have a sensitivity difference.

(2)

The solid state imaging device according to the above-described (1), further including a drive control unit that sets, among a first pixel and a second pixel included in the plurality of pixels below a first microlens of the pixel array unit, a first exposure time for the first pixel and a second exposure time for the second pixel, and sets the first exposure time for the first pixel and the second pixel included in the plurality of pixels below a second microlens of the pixel array unit.

(3)

The solid state imaging device according to the above-described (2), further including a signal processing circuit that generates a signal with an expanded dynamic range using pixel signals of the first pixel and the second pixel below the first microlens, and outputs pixel signals of the first pixel and the second pixel below the second microlens as a phase difference signal.

(4)

The solid state imaging device according to the above-described (3), wherein the signal processing circuit also has a mode for adding up and outputting the phase difference signals of a plurality of frames.

(5)

The solid state imaging device according to any of the above-described (2) to (4), wherein the drive control unit also has a mode for setting all the pixels of the pixel array unit to the same exposure time.

(6)

The solid state imaging device according to any of the above-described (2) to (5), wherein the drive control unit changes, in a first mode and a second mode, an exposure time ratio between the first exposure time for the first pixel below the first microlens and the second exposure time for the second pixel.

(7)

The solid state imaging device according to any of the above-described (1) to (6), wherein the first pixel and the second pixel have the sensitivity difference due to displacement between an optical axis of the microlens and a center position of the plurality of pixels.

(8)

The solid state imaging device according to the above-described (7), wherein opening areas of a light shielding film formed above the light receiving regions are further different.

(9)

The solid state imaging device according to any of the above-described (3) to (8), wherein the signal processing circuit also performs a process for correcting the sensitivity difference caused by the displacement between the optical axis of the microlens and the center position of the plurality of pixels.

(10)

The solid state imaging device according to any of the above-described (1) to (9), configured such that a first semiconductor substrate and a second semiconductor substrate are laminated together.

(11)

A drive control method for a solid state imaging device, wherein a pixel array unit is configured such that a plurality of pixels each having the same light receiving region is arranged in a matrix, and light that has entered a single microlens enters the plurality of pixels adjacent to each other, and a first pixel and a second pixel included in the plurality of pixels below the microlens of the pixel array unit are set to have a sensitivity difference.

(12)

An electronic apparatus including a solid state imaging device, wherein the solid state imaging device includes a pixel array unit configured such that a plurality of pixels each having the same light receiving region is arranged in a matrix, and light that has entered a single microlens enters the plurality of pixels adjacent to each other, and the solid state imaging device is configured such that a first pixel and a second pixel included in the plurality of pixels below the microlens of the pixel array unit are set to have a sensitivity difference.

(13)

An image processing method, wherein a pixel array unit in which a plurality of pixels each having the same light receiving region is arranged in a matrix is configured such that light that has entered a single microlens enters the plurality of pixels adjacent to each other, and a signal processing circuit, which processes a signal output from a solid state imaging device in which the plurality of pixels are classified into a high-sensitivity pixel and a low-sensitivity pixel due to displacement between an optical axis of the microlens and a center position of the plurality of pixels, executes a predetermined signal process using a high-sensitivity pixel signal output from the high-sensitivity pixel and a low-sensitivity pixel signal output from the low-sensitivity pixel.

(14)

The image processing method according to the above-described (13), wherein the signal processing circuit generates and outputs a pixel signal with an expanded dynamic range using the high-sensitivity pixel signal and the low-sensitivity pixel signal.

(15)

The image processing method according to the above-described (13), wherein the signal processing circuit generates and outputs a pixel signal in which a sensitivity difference between the high-sensitivity pixel and the low-sensitivity pixel has been corrected using the high-sensitivity pixel signal and the low-sensitivity pixel signal.

(16)

An electronic apparatus including:

a solid state imaging device at least having a pixel array unit configured such that a plurality of pixels each having the same light receiving region is arranged in a matrix, and light that has entered a single microlens enters the plurality of pixels adjacent to each other; and a signal processing circuit that executes a predetermined signal process using a high-sensitivity pixel signal output from a high-sensitivity pixel and a low-sensitivity pixel signal output from a low-sensitivity pixel, wherein the plurality of pixels are classified into the high-sensitivity pixel and the low-sensitivity pixel due to displacement between an optical axis of the microlens and a center position of the plurality of pixels.

REFERENCE SIGNS LIST

1 Solid state imaging device
2 Pixel
3 Pixel array unit
4 Vertical drive circuit
8 Control circuit
12 Signal processing circuit
13 Semiconductor substrate
21 Photodiode
31 Microlens
34 Light shielding film
53 Image processing unit
71 Light shielding film
91 First semiconductor substrate
92 Second semiconductor substrate
93 First semiconductor substrate
94 Second semiconductor substrate
101 Imaging device
104 Solid state imaging device
250 Pair of sensitivity difference pixels
251 Pair of low-sensitivity phase difference pixels
252 Pair of high-sensitivity phase difference pixels

The invention claimed is:

1. A solid state imaging device, comprising:
a pixel array unit that includes a plurality of pixels in a matrix, wherein each of the plurality of pixels has a light receiving region having a same size;
a plurality of microlenses, wherein
the plurality of pixels includes a first pixel and a second pixel,
the first pixel comprises a first light receiving region,
the second pixel comprises a second light receiving region, and
each pixel of the plurality of pixels is configured to receive light from a corresponding microlens of the plurality of microlenses;
a drive control circuit configured to set a first exposure time for the first pixel and a second exposure time for the second pixel, wherein
the first pixel and the second pixel are below a first microlens of the plurality of microlenses, and
the first pixel has a first center position and the second pixel has a second center position; and
a signal processing circuit configured to:
obtain a sensitivity ratio of a first sensitivity of the first pixel and a second sensitivity of the second pixel;
output a signal of an expanded dynamic range based on pixel signals of the first pixel and the second pixel, and
the sensitivity ratio;
correct a sensitivity difference between the first sensitivity of the first pixel and the second sensitivity of the second pixel based on the sensitivity ratio, wherein the sensitivity difference is based on a displacement of an optical axis of the first microlens relative to the first center position of the first pixel and the second center position of the second pixel; and output pixel signals of a third pixel of the plurality of pixels and a fourth pixel of the plurality of pixels as a phase difference signal,
wherein the third pixel and the fourth pixel are below a second microlens of the plurality of microlenses.

2. The solid state imaging device according to claim 1, wherein
each of the first pixel and the second pixel is configured to receive the light from the first microlens,
each of the third pixel and the fourth pixel is configured to receive the light from the second microlens, and
the drive control circuit is further configured to set the first exposure time for the third pixel and the second exposure time for the fourth pixel.

3. The solid state imaging device according to claim 1, wherein
the signal processing circuit is further configured to:
add a plurality of phase difference signals of a plurality of frames; and
output the added plurality of phase difference signals, and
the added plurality of phase difference signals includes at least the phase difference signal of the third pixel and the fourth pixel.

4. The solid state imaging device according to claim 1, wherein the drive control circuit is further configured to set each pixel of the plurality of pixels of the pixel array unit to a same exposure time.

5. The solid state imaging device according to claim 1, wherein the drive control circuit is further configured to change, in each of a first mode and a second mode, an exposure time ratio between the first exposure time and the second exposure time.

6. The solid state imaging device according to claim 1, further comprising a first semiconductor substrate and a second semiconductor substrate that are laminated together.

7. The solid state imaging device according to claim 1, further comprising a light shielding film, wherein a first opening area of the light shielding film above the second light receiving region is larger than a second opening area of the light shielding film above the first light receiving region.

8. A method, comprising:
in a solid state imaging device that includes a plurality of pixels and a plurality of microlenses, wherein the plurality of pixels are in a matrix and each of the plurality of pixels has a light receiving region having a same size:
receiving light from at least one microlens of the plurality of microlenses such that the light enters at least one corresponding pixel of the plurality of pixels;
setting, by a drive control circuit, a first exposure time for a first pixel of the plurality of pixels and a second exposure time for a second pixel of the plurality of pixels, wherein
the first pixel and the second pixel are below a first microlens of the plurality of microlenses, and
the first pixel has a first center position and the second pixel has a second center position;
obtaining, by a signal processing circuit, a sensitivity ratio of a first sensitivity of the first pixel and a second sensitivity of the second pixel;
outputting, by the signal processing circuit, a signal of an expanded dynamic range based on
pixel signals of the first pixel and the second pixel, and
the sensitivity ratio;
correcting, by the signal processing circuit, a sensitivity difference between the first sensitivity of the first pixel and the second sensitivity of the second pixel based on the sensitivity ratio,
wherein the sensitivity difference is based on a displacement of an optical axis of the first microlens relative to the first center position of the first pixel and the second center position of the second pixel; and
outputting, by the signal processing circuit, pixel signals of a third pixel of the plurality of pixels and a fourth pixel of the plurality of pixels as a phase difference signal,
wherein the third pixel and the fourth pixel are below a second microlens of the plurality of microlenses.

9. An electronic apparatus, comprising
a solid state imaging device that includes:
a pixel array unit that includes a plurality of pixels in a matrix, wherein each of the plurality of pixels has a light receiving region having a same size;
a plurality of microlenses, wherein
the plurality of pixels includes a first pixel and a second pixel, and
each of the first pixel and the second pixel is configured to receive light from a first microlens of the plurality of microlenses;
a drive control circuit configured to set a first exposure time for the first pixel and a second exposure time for the second pixel, wherein
the first pixel and the second pixel are below the first microlens, and
the first pixel has a first center position and the second pixel has a second center position; and
a signal processing circuit configured to:
obtain a sensitivity ratio of a first sensitivity of the first pixel and a second sensitivity of the second pixel;
output a signal of an expanded dynamic range based on pixel signals of the first pixel and the second pixel, and
the sensitivity ratio;
correct a sensitivity difference between the first sensitivity of the first pixel and the second sensitivity of the second pixel based on the sensitivity ratio,
wherein the sensitivity difference is based on a displacement of an optical axis of the first microlens relative to the first center position of the first pixel and the second center position of the second pixel; and
output pixel signals of a third pixel of the plurality of pixels and a fourth pixel of the plurality of pixels as a phase difference signal, wherein the third pixel and the fourth pixel are below a second microlens of the plurality of microlenses.

10. An image processing method, comprising:
in a solid state imaging device that includes a plurality of pixels and a plurality of microlenses, wherein the plurality of pixels are in a matrix and each of the plurality of pixels has a light receiving region having a same size, and a high-sensitivity pixel of the plurality of pixels has a first center position and a low-sensitivity pixel of the plurality of pixels has a second center position:
processing, by a signal processing circuit, an output signal output from the solid state imaging device in which the plurality of pixels are classified into the high-sensitivity pixel and the low-sensitivity pixel, wherein the plurality of pixels are classified based on a displacement of an optical axis of a first microlens of the plurality of microlenses relative to the first center position and the second center position;

executing, by the signal processing circuit, a signal process based on a high-sensitivity pixel signal output from the high-sensitivity pixel and a low-sensitivity pixel signal output from the low-sensitivity pixel;

setting, by a drive control circuit, a first exposure time for the high-sensitivity pixel and a second exposure time for the low-sensitivity pixel, wherein the high-sensitivity pixel and the low-sensitivity pixel are below the first microlens;

obtaining, by the signal processing circuit, a sensitivity ratio of a first sensitivity of the high-sensitivity pixel and a second sensitivity of the low-sensitivity pixel;

outputting, by the signal processing circuit, a signal of an expanded dynamic range based on
pixel signals of the high-sensitivity pixel and the low-sensitivity pixel, and
the sensitivity ratio;

correcting, by the signal processing circuit, a sensitivity difference between the first sensitivity of the high-sensitivity pixel and the second sensitivity of the low-sensitivity pixel based on the sensitivity ratio,
wherein the sensitivity difference is based on the displacement of the optical axis of the first microlens relative to the first center position and the second center position; and outputting, by the signal processing circuit, pixel signals of a first phase difference pixel of the plurality of pixels and a second phase difference pixel of the plurality of pixels as a phase difference signal,
wherein the first phase difference pixel and the second phase difference pixel are below a second microlens of the plurality of microlenses.

11. The image processing method according to claim 10, further comprising:
correcting the sensitivity difference based on the high-sensitivity pixel signal and the low-sensitivity pixel signal;
generating a pixel signal based on the corrected sensitivity difference; and
outputting the generated pixel signal.

12. An electronic apparatus, comprising:
a solid state imaging device that includes:
a pixel array unit that includes a plurality of pixels in a matrix, wherein each of the plurality of pixels has a light receiving region having a same size;
a plurality of microlenses, wherein
the plurality of pixels includes a high-sensitivity pixel and a low-sensitivity pixel, and
the high-sensitivity pixel has a first center position and the low-sensitivity pixel has a second center position;
a drive control circuit configured to set a first exposure time for the high-sensitivity pixel and a second exposure time for the low-sensitivity pixel,
wherein the high-sensitivity pixel and the low-sensitivity pixel are below a first microlens of the plurality of microlenses; and
a signal processing circuit configured to:
obtain a sensitivity ratio of a first sensitivity of the high-sensitivity pixel and a second sensitivity of the low-sensitivity pixel;
output a signal of an expanded dynamic range based on
a high-sensitivity pixel signal output from the high-sensitivity pixel and a low-sensitivity pixel signal output from the low-sensitivity pixel, and
the sensitivity ratio,
wherein the plurality of pixels are classified into the high-sensitivity pixel and the low-sensitivity pixel based on a displacement of an optical axis of the first microlens relative to the first center position of the high-sensitivity pixel and the second center position of the low-sensitivity pixel;
correct a sensitivity difference between the first sensitivity of the high-sensitivity pixel and the second sensitivity of the low-sensitivity pixel based on the sensitivity ratio,
wherein the sensitivity difference is based on the displacement of the optical axis of the first microlens relative to the first center position of the high-sensitivity pixel and the second center position of the low-sensitivity pixel; and
output pixel signals of a first phase difference pixel of the plurality of pixels and a second phase difference pixel of the plurality of pixels as a phase difference signal,
wherein the first phase difference pixel and the second phase difference pixel are below a second microlens of the plurality of microlenses.

* * * * *